(12) United States Patent
Liang et al.

(10) Patent No.: US 11,303,295 B1
(45) Date of Patent: Apr. 12, 2022

(54) SDM ENCODER AND RELATED SIGNAL PROCESSING SYSTEM

(71) Applicant: xMEMS Labs, Inc., Santa Clara, CA (US)

(72) Inventors: Jemm Yue Liang, Sunnyvale, CA (US); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/452,403

(22) Filed: Oct. 26, 2021

Related U.S. Application Data

(60) Provisional application No. 63/176,240, filed on Apr. 17, 2021, provisional application No. 63/156,651, filed on Mar. 4, 2021, provisional application No. 63/113,912, filed on Nov. 15, 2020.

(51) Int. Cl.
| | | |
|---|---|---|
| *H03M 3/00* | (2006.01) | |
| *H03H 17/04* | (2006.01) | |
| *H03H 17/06* | (2006.01) | |
| *G10L 19/032* | (2013.01) | |
| *H03H 17/00* | (2006.01) | |
| *H03F 3/20* | (2006.01) | |

(52) U.S. Cl.
CPC ........... *H03M 3/424* (2013.01); *G10L 19/032* (2013.01); *H03H 17/0411* (2013.01); *H03H 17/0614* (2013.01); *H03F 3/20* (2013.01); *H03F 2200/03* (2013.01); *H03H 2017/009* (2013.01); *H03H 2017/0081* (2013.01)

(58) Field of Classification Search
CPC ........................... H03M 3/324; H03H 17/0614
See application file for complete search history.

(56) References Cited

U.S. PATENT DOCUMENTS

| | | | | |
|---|---|---|---|---|
| 7,362,252 | B1* | 4/2008 | Pai | H03M 1/0663 341/143 |
| 2007/0241950 | A1* | 10/2007 | Petilli | H03M 3/398 341/143 |
| 2010/0103003 | A1* | 4/2010 | Deval | H03M 3/33 341/118 |
| 2016/0065177 | A1* | 3/2016 | Chappaz | H03K 7/08 332/107 |

* cited by examiner

*Primary Examiner* — Chuong D Ngo
(74) *Attorney, Agent, or Firm* — Winston Hsu

(57) ABSTRACT

A signal density modulation (SDM) encoder includes a first subtractor, a sigma circuit and a multi-bit quantizer. The first subtractor is used for receiving an input signal. The sigma circuit is coupled to the first subtractor. The multi-bit quantizer, coupled to the first subtractor and the sigma circuit, is configured to generate an output signal. The sigma circuit or the multi-bit quantizer produces a first feedback signal to the first subtractor. The first subtractor performs a subtraction operation according to the first feedback signal and the input signal, and generates a delta signal. The sigma circuit performs an operation on the delta signal, such that the SDM encoder has a noise transfer function having a high pass filtering effect. The noise transfer function is a ratio of a quantization error brought by the multi-bit quantizer with respect to the input signal. The output signal has more than two levels.

24 Claims, 22 Drawing Sheets

SDM ENCODER AND RELATED SIGNAL PROCESSING SYSTEM

CROSS REFERENCE TO RELATED APPLICATIONS

This application claims the benefit of U.S. Provisional Application No. 63/113,912, filed on Nov. 15, 2020, U.S. Provisional Application No. 63/156,651, filed on Mar. 4, 2021, and U.S. Provisional Application No. 63/176,240, filed on Apr. 17, 2021. The contents of these applications are incorporated herein by reference.

BACKGROUND OF THE INVENTION

1. Field of the Invention

The present invention relates to a signal density modulation (SDM) encoder and a related signal processing system, and more particularly, to an SDM encoder and a related signal processing system applicable to an audio system.

2. Description of the Prior Art

Pulse density modulation (PDM), an encoding scheme frequently used with microphones, refers to a method of encoding the underlying analog signal by the density of a 1-bit data stream. By treating logic "1" as signal level "+1" and logic "0" as signal level "−1", normalized analog signal between levels {+1, −1} can be represented by the density of a highly oversampled bit stream of "1"s and "0" s.

In general, the PDM system may use a comparator in its output stage, to generate a pulse signal swinging between the levels "+1" and "−1", and the information is carried in the density of the pulses. In such a situation, the PDM system requires signal toggling between the levels "+1" and "−1" in an extremely high frequency, and the levels are usually the maximum level and the minimum level output by the comparator. If the PDM system is configured to drive a capacitive load, the high-frequency signal toggling between the maximum and minimum levels will result in a tremendous loss of energies. Thus, there is a need for providing a novel modulation scheme for keeping a satisfactory signal-to-quantization-noise ratio (SQNR) while signal energies are utilized more efficiently.

SUMMARY OF THE INVENTION

It is therefore an objective of the present invention to provide a signal density modulation (SDM) encoder as an improvement of the pulse density modulation (PDM), in order to solve the abovementioned problems.

An embodiment of the present invention discloses an SDM encoder, which comprises a first subtractor, a sigma circuit and a multi-bit quantizer. The first subtractor is used for receiving an input signal. The sigma circuit is coupled to the first subtractor. The multi-bit quantizer, coupled to the first subtractor and the sigma circuit, is configured to generate an output signal. Wherein, the sigma circuit or the multi-bit quantizer produces a first feedback signal to the first subtractor; the first subtractor performs a subtraction operation according to the first feedback signal and the input signal, and generates a delta signal; the sigma circuit performs an operation on the delta signal, such that the SDM encoder has a noise transfer function having a high pass filtering effect; the noise transfer function is a ratio of a quantization error brought by the multi-bit quantizer with respect to the input signal; and the output signal has more than two levels.

Another embodiment of the present invention discloses a signal processing system, which comprises a first subtractor and a sigma circuit. The first subtractor is used for receiving an input signal. The sigma circuit is coupled to the first subtractor. Wherein, the signal processing system is applied to a distortion portion; the distortion portion produces a distortion component; the sigma circuit produces a first feedback signal to the first subtractor; the first subtractor performs a first subtraction operation according to the first feedback signal and the input signal, and generates a delta signal; the sigma circuit performs an operation on the delta signal, such that the signal processing system has a noise transfer function having a high pass filtering effect; the noise transfer function is a ratio of the distortion component brought by the distortion portion with respect to the input signal; and the distortion portion comprises no 1-bit quantizing circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
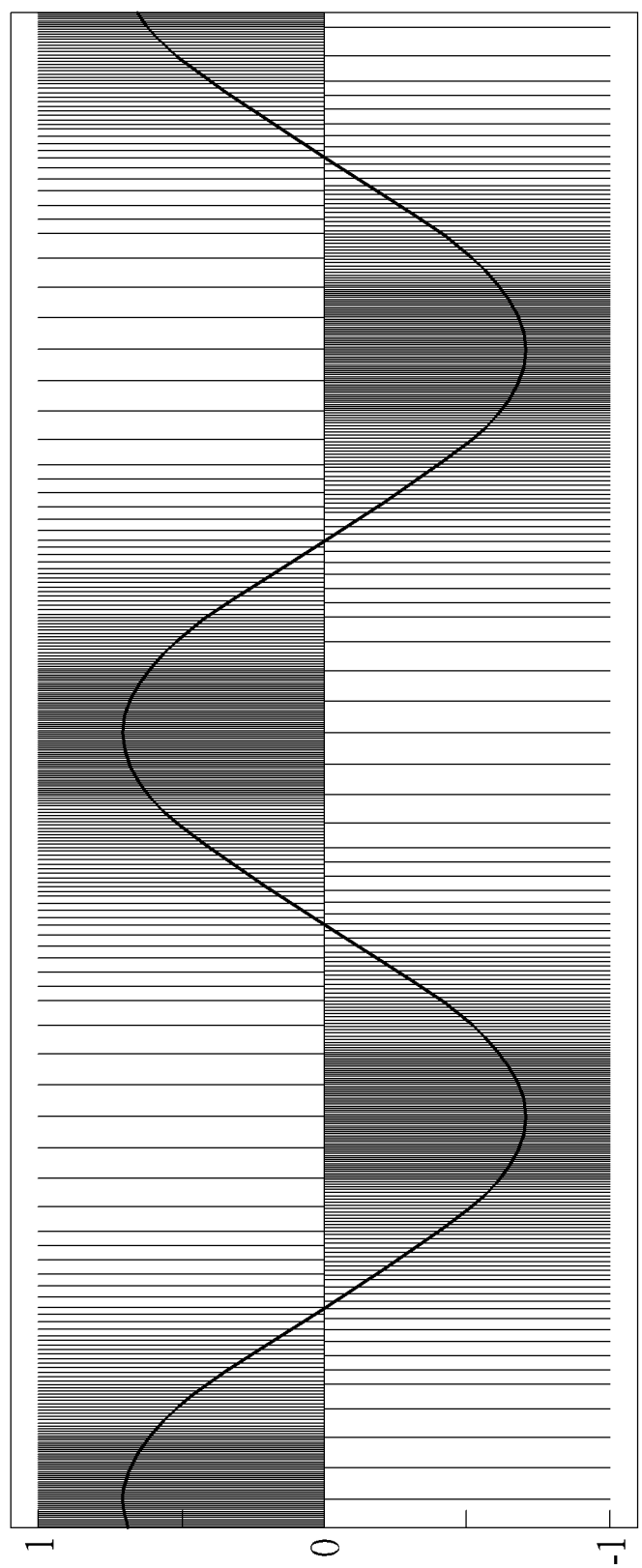
FIG. 1 is a waveform diagram of a PDM encoder.

Please refer to FIG. 1, which is a waveform diagram of a pulse density modulation (PDM) encoder. Supposing that the PDM encoder receives a sinusoidal signal, this sinusoidal signal may be oversampled with a high frequency to generate output pulses in the oversample rate. As shown in FIG. 1, the pulse density of the output signal increases and decreases following the amplitude of the input signal. The pulses have two levels "+1" and "−1", which correspond to positive amplitude and negative amplitude, respectively.

Figure 2:
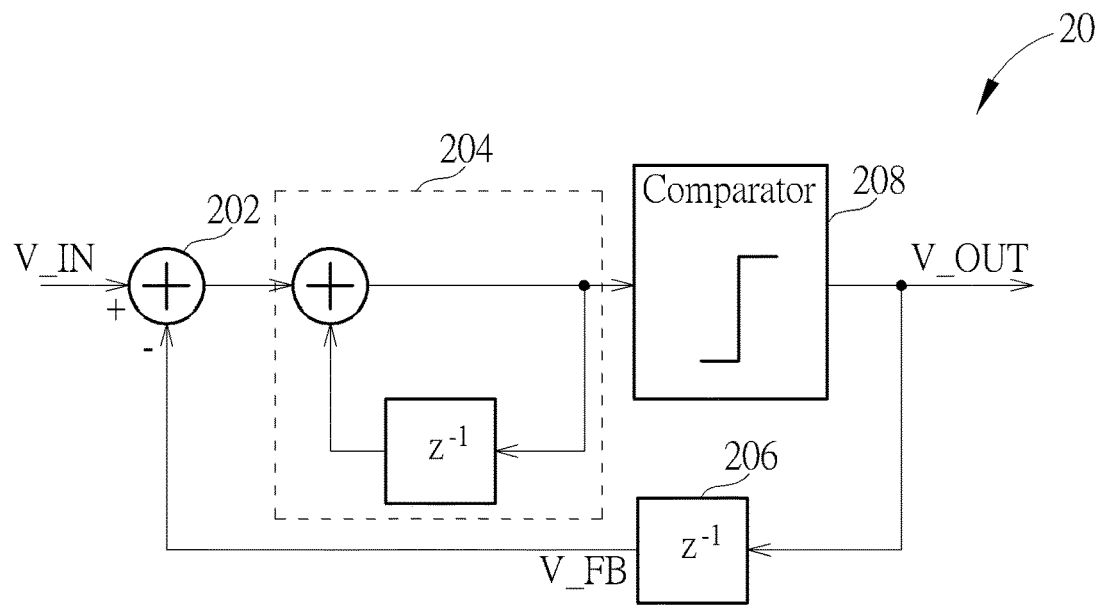
FIG. 2 is a schematic diagram of a PDM circuit.

The PDM encoder is usually realized by using a sigma-delta ($\Sigma$-$\Delta$) modulation scheme. Please refer to FIG. 2, which is a schematic diagram of a PDM circuit 20. As shown in FIG. 2, the PDM circuit 20, which performs a $1^{st}$-order sigma-delta operation, includes a subtractor 202, an integrator 204, a delay element 206 and a comparator 208. The PDM circuit 20 may generate high-frequency pulses in an output signal V_OUT by receiving an input signal V_IN, where the pulse density of the output signal V_OUT corresponds to the amplitude of the input signal V_IN. The subtractor 202 may subtract a feedback signal V_FB from the input signal V_IN, where the feedback signal V_FB is generated by delaying the output signal V_OUT with the delay element 206. The integrator 204 is configured to accumulate the information of the signal amplitude in the input signal V_IN and the information of the feedback signal V_FB. The comparator 208 may output a pulse when the accumulation result of the integrator 204 exceeds a threshold. Therefore, the pulse density in the output signal V_OUT output by the comparator 208 may follow the amplitude of the input signal V_IN. For example, higher positive amplitude will generate a higher pulse density of the "+1" pulses, and lower negative amplitude will generate a higher pulse density of the "−1" pulses.

The performance of the PDM encoder may be improved by using a higher order sigma-delta structure. For example, a $2^{nd}$-order sigma-delta operation may be realized by 2 subtractors and 2 integrators. The implementations of the higher-order sigma-delta operation are well known by those skilled in the art and will not be detailed herein.

Figure 3:
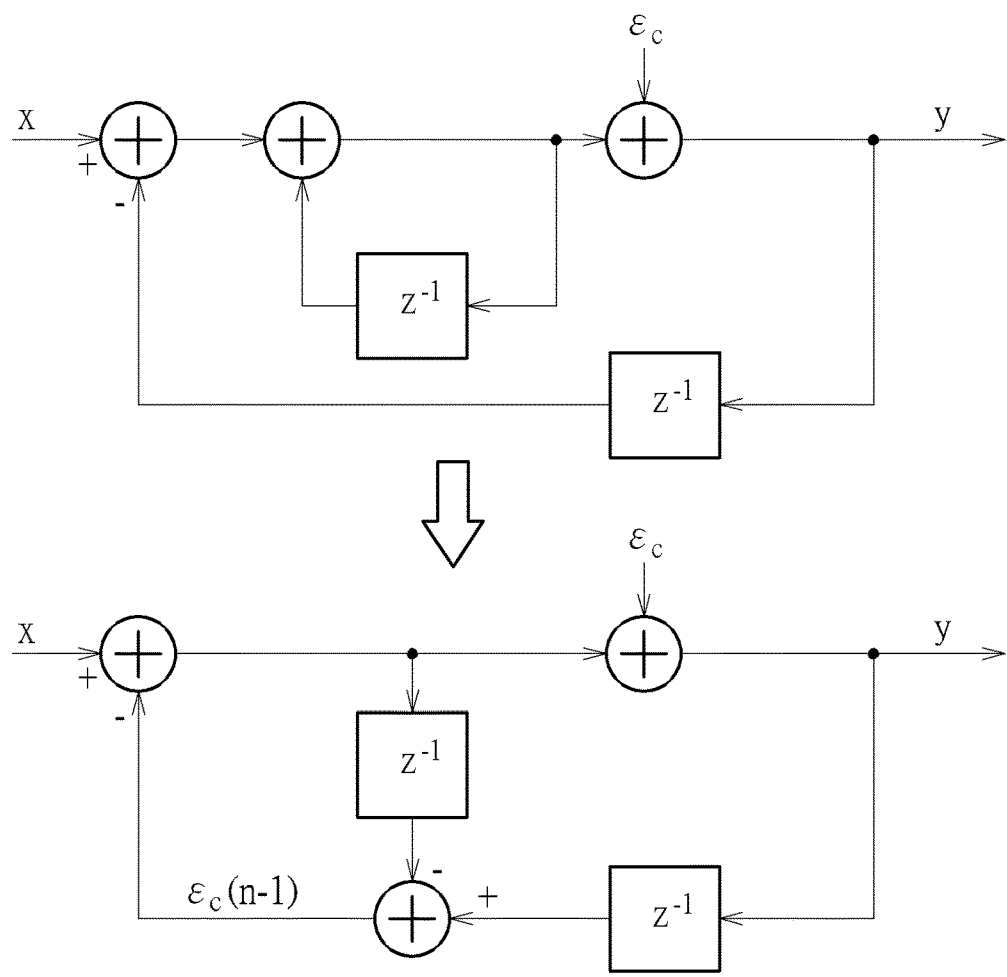
FIG. 3 illustrates an equivalent circuit of the structure of the PDM circuit.

Please note that the comparator 208 may be considered as a 1-bit quantizer, which generates the output pulses by introducing a quantization error on the received signal. Therefore, the structure of the PDM circuit 20 may be equivalently modified as shown in FIG. 3. For the sake of simplicity, the input signal and the output signal are denoted by x and y, respectively, in this implementation. With the quantization error $\varepsilon_c$ included, the transfer function of the PDM circuit in z-domain is described as follows:

$$Y(z)=X(z)+(1-z^{-1})E_C(z).$$

The PDM circuit may be considered as a system having two inputs X(z) and $E_C$(z) and one output Y(z). The signal transfer function (STF) is 1, and the noise transfer function (NTF) is $(1-z^{-1})$.

Figure 4:
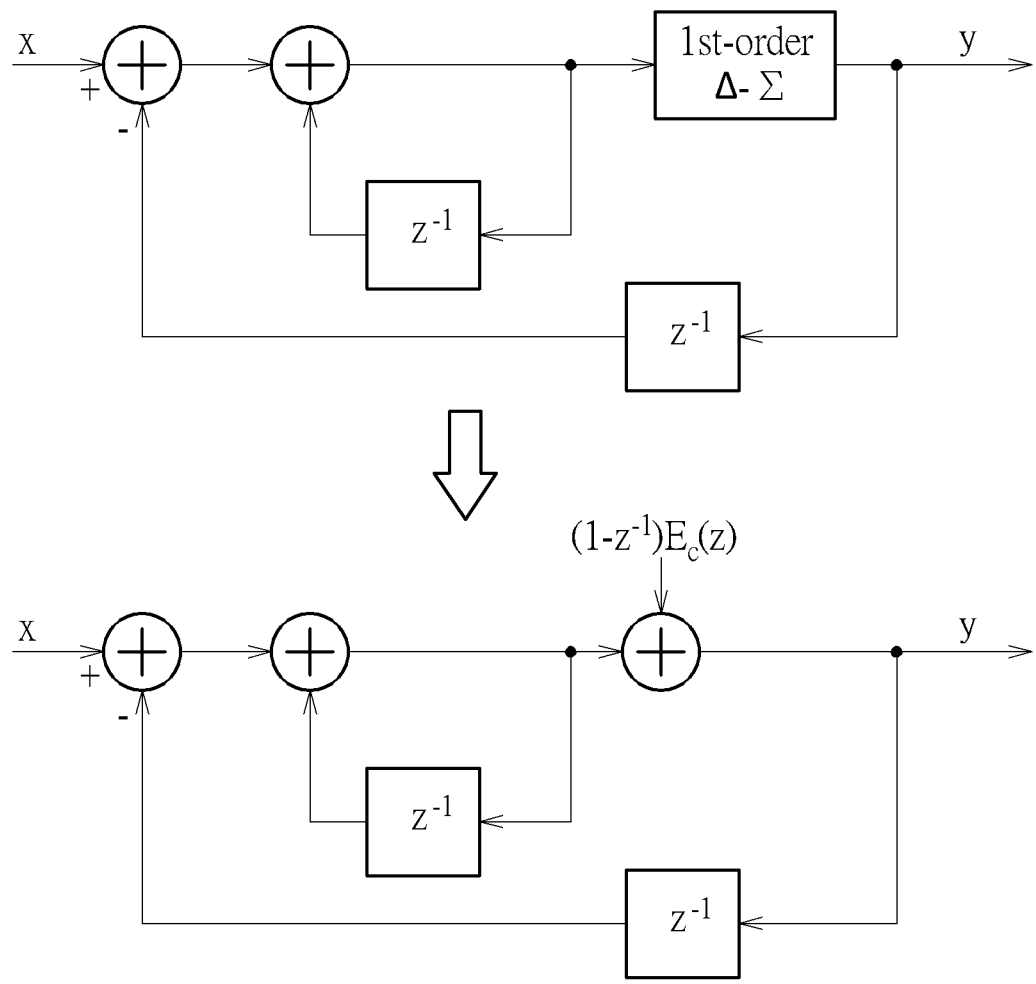
FIG. 4 is a circuit diagram of the PDM circuit with the $2^{nd}$-order sigma-delta operation.

In a similar manner, the PDM circuit with the $2^{nd}$-order sigma-delta operation has a circuit diagram as shown in FIG. 4, where the transfer function in z-domain is described as follows:

$$Y(z)=X(z)+(1-z^{-1})^2 E_C(z).$$

In this implementation, the STF is 1, and the NTF is $(1-z^{-1})^2$. Therefore, the transfer functions of the PDM circuit with an $L^{th}$-order sigma-delta operation may generally be represented as:

$$Y(z)=X(z)+(1-z^{-1})^L E_C(z);$$

where the STF is 1 and the NTF is $(1-z^{-1})^L$.

Figure 5:
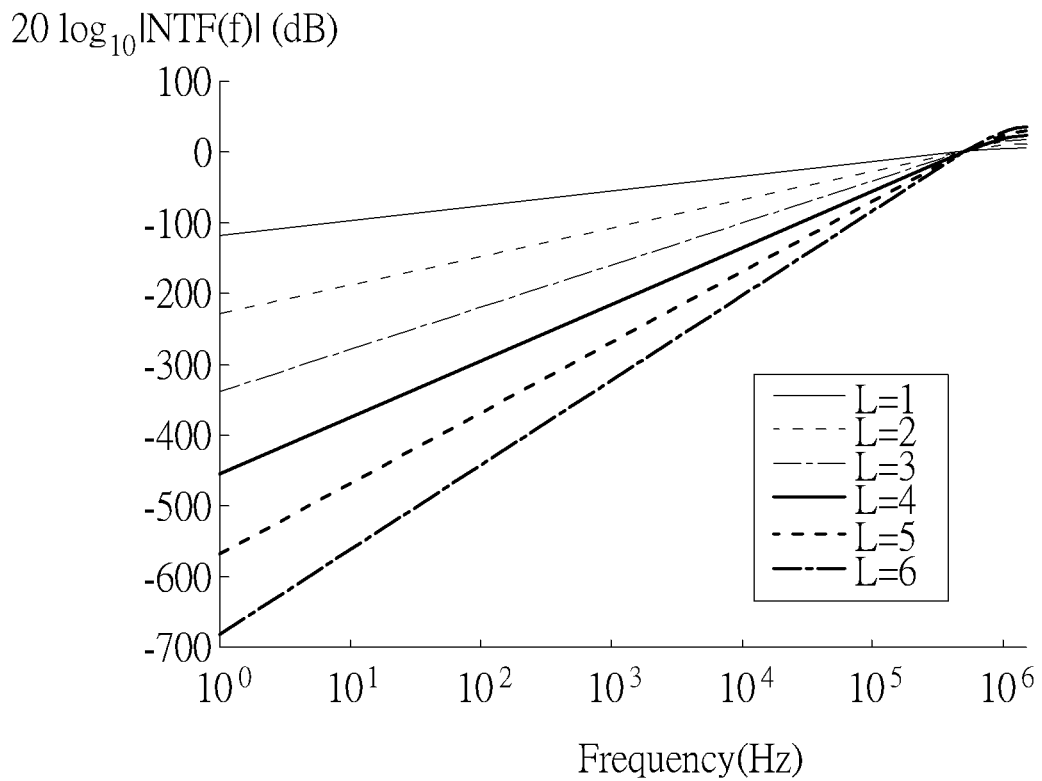
FIG. 5 illustrates the comparison of the PDM circuit performing an $L^{th}$-order sigma-delta operation.

Please refer to FIG. 5, which illustrates the comparison of the PDM circuit performing an $L^{th}$-order sigma-delta operation, where L is a positive integer, e.g., from 1 to 6. More specifically, FIG. 5 illustrates the frequency response of the NTF of the PDM circuit with a sigma-delta operation, e.g., from the $1^{st}$-order to the $6^{th}$-order. As shown in FIG. 5, the PDM circuit may provide the noise shaping function, which shifts the unwanted noises to higher frequencies. A higher order sigma-delta operation may provide a stronger noise suppression capability in the low frequencies. In addition, the unity gain frequency where the NTF equals 1 is equal to the sampling frequency $f_s$ divided by 6. Therefore, the sampling frequency $f_s$ may be well controlled to be higher enough to suppress the noises in the audible frequency range, i.e., 20 Hz to 20 kHz.

Therefore, with an appropriate design of the PDM circuit, a preferable noise shaping performance may be realized by performing a higher-order sigma-delta operation. However, the sigma-delta filter or circuit, a circuit performing sigma-delta operation, has a stability issue, where a typical sigma-delta filter over the 3rd or $4^{th}$ order will become unstable. Fortunately, the industry has developed several modifications of the sigma-delta filter to maintain the system stability in a higher order.

In an example, a Butterworth high pass filter may be used as the sigma-delta filter to perform noise shaping. The Butterworth filter has a flat magnitude in the higher frequency band, where the high frequency noises are prevented from increasing unlimitedly, thereby improving the overall system stability.

Figure 6:
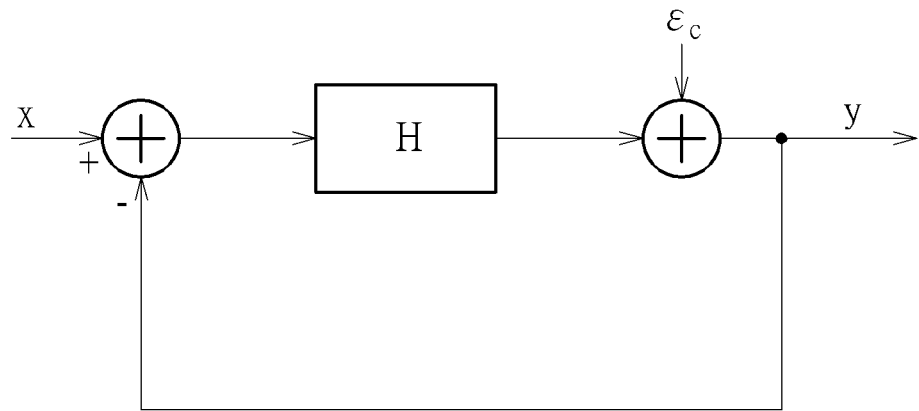
FIG. 6 illustrates a circuit model of the exemplary sigma-delta filter.

FIG. 6 illustrates a circuit model of the exemplary sigma-delta filter. As shown in FIG. 6, the circuit model may realize the transfer function described as follows:

$$Y = \frac{H}{1+H}X + \frac{1}{1+H}E_C;$$

where the STF is H/(1+H) and the NTF is 1/(1+H). With a 3rd-order Butterworth high pass filter used for noise transfer, the NTF may be represented as:

$$NTF(z) = \frac{1 - 3z^{-1} + 3z^{-2} - z^{-3}}{1 - 1.45903z^{-1} + 0.91037z^{-2} - 0.19783z^{-3}}.$$

The NTF may in turn be used to calculate the transfer function H of the filter, which may be determined as:

$$H(z) = \frac{1}{NTF(z)} - 1 = \frac{1.54097z^{-1} - 2.08963z^{-2} + 0.80217z^{-3}}{1 - 3z^{-1} + 3z^{-2} - z^{-3}}.$$

Figure 7:
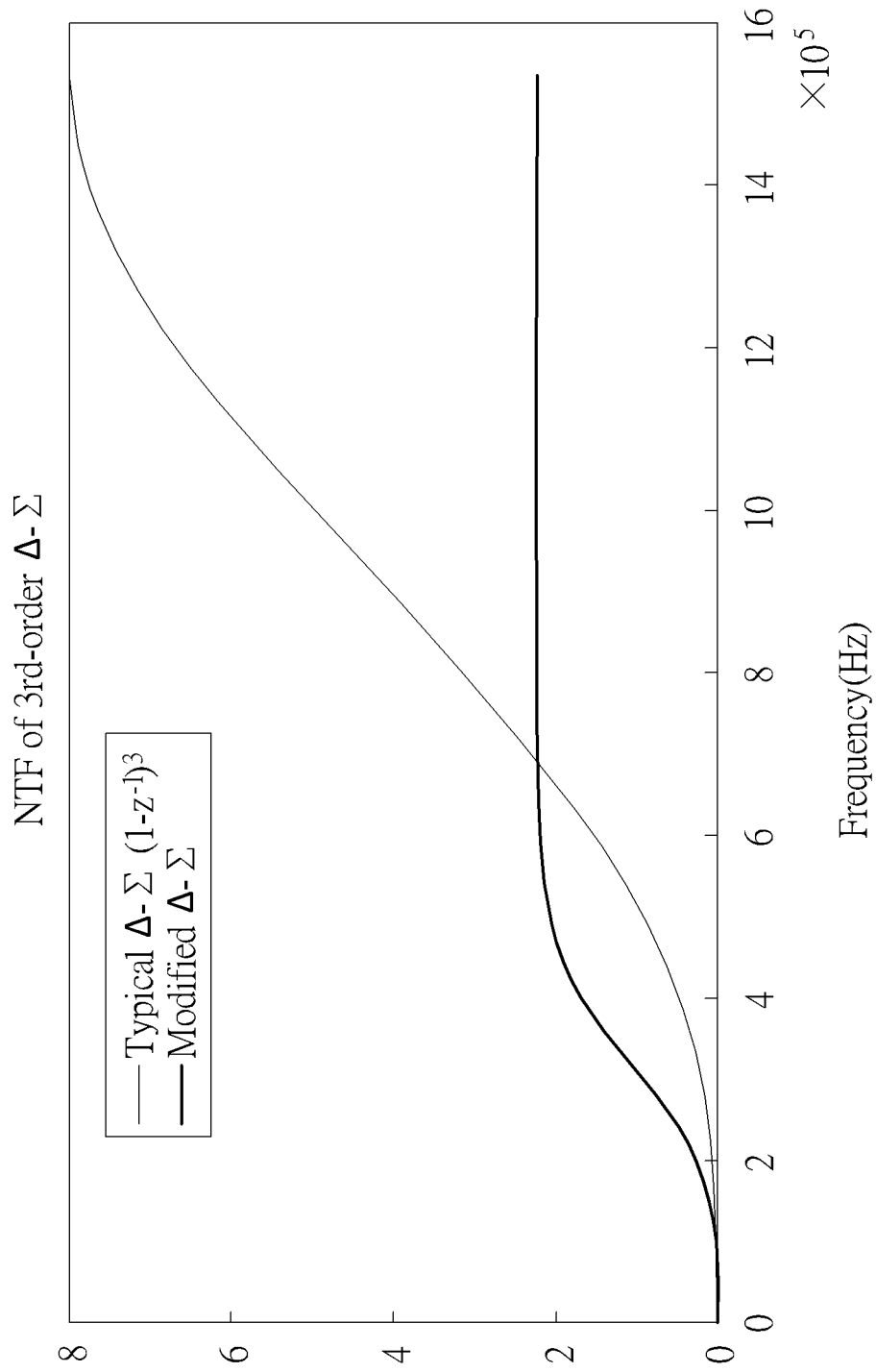
FIG. 7 illustrates the comparison of the NTF of the typical $3^{rd}$-order sigma-delta filter and the modified $3^{rd}$-order sigma-delta filter.

Please refer to FIG. 7, which illustrates the comparison of the NTF of the typical $3^{rd}$-order sigma-delta filter and the modified $3^{rd}$-order sigma-delta filter. As shown in FIG. 7, the noises may be amplified and the NTF of the typical $3^{rd}$-order sigma-delta filter may keep increasing in the higher frequency band. In comparison, with the $3^{rd}$-order Butterworth high pass filter applied as the modified sigma-delta filter to replace the typical $3^{rd}$-order sigma-delta filter, the frequency response shows that the NTF is flat in the higher frequency band instead of increasing unlimitedly. This implementation ensures that the system may be stable even in a higher-order sigma-delta structure.

Therefore, with the technique of improving system stability as described above, a higher-order sigma-delta filter may be used to enhance the noise shaping capability of the PDM circuit, thereby increasing the signal-to-quantization-noise ratio (SQNR) (or called signal-to-noise distortion ratio, SNDR, for a distortion carried in the signal) of the system. A simulation result shows that a PDM circuit using a $6^{th}$-order sigma-delta filter may achieve an SQNR substantially identical to that achieved by a 16-bit pulse code modulation (PCM) circuit under the same oversample rate.

As mentioned above, the PDM circuit applies a comparator (i.e., a 2-level quantizer or 1-bit quantizer) to generate output pulses toggling in the oversampling frequency, which is usually far higher than the frequency of the input signal. The high-frequency toggles will generate large power consumption, especially when the PDM circuit is configured to drive a capacitive load. In order to solve the problem, the present invention provides a signal density modulation (SDM) encoder. Instead of the comparator, a 2-bit quantizer (or quantizing circuit), the SDM encoder applies a multi-bit quantizer capable of generating output signals having more than two levels.

More specifically, the conventional comparator allows the output signal to swing over a peak-to-peak voltage Vpp or between the signal levels "+1" and "−1", which may be represented by a one-bit digital signal. When the operating frequency increases or the capacitance of the capacitive load is large, power consumption would be undesirably large. In comparison, with the usage of the multi-bit quantizer, the output signal is allowed to swing within a reduced step(s) between more than two levels. The power consumption would be significantly reduced when SDM is exploited. Multiple levels (more than 2 levels) produced by multi-bit quantizer also reflect the information generated from the subtractor(s) and the integrator(s) thereof more faithfully or finely. Accompanying with the sigma-delta operation, SQNR and/or resolution would be significantly enhanced.

Figure 8:
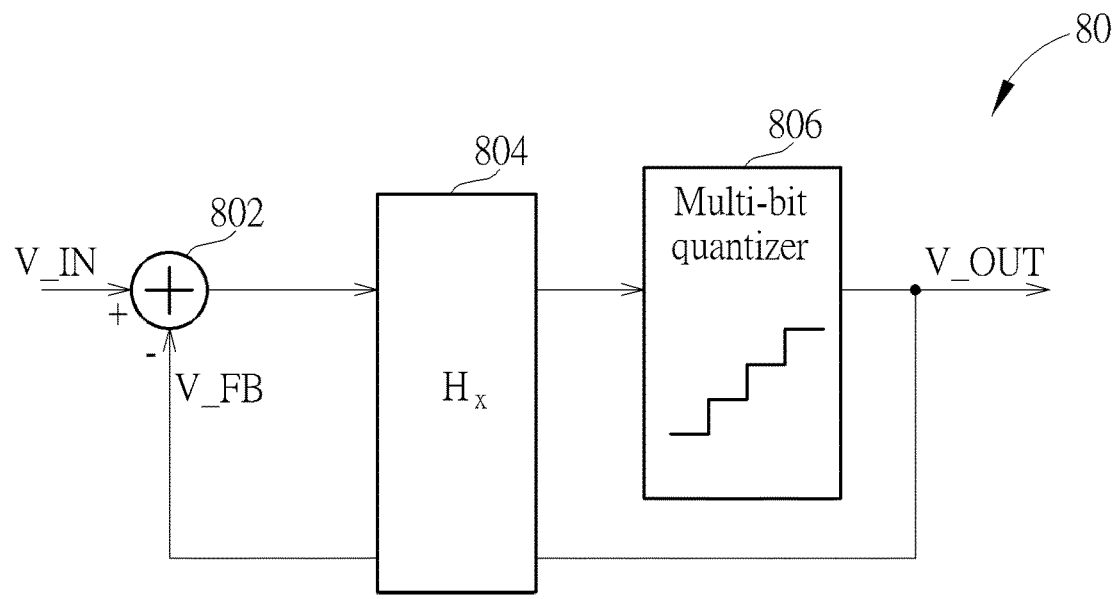
FIG. 8 is a schematic diagram of an SDM encoder according to an embodiment of the present invention.

Please refer to FIG. 8, which is a schematic diagram of an SDM encoder 80 according to an embodiment of the present invention. As shown in FIG. 8, the SDM encoder 80 includes a subtractor 802, a sigma circuit 804 and a multi-bit quantizer 806. The subtractor 802 and the sigma circuit 804 may cooperate to provide the sigma-delta operation similar to which of the PCM circuit described above. More specifically, the subtractor 802 is configured to receive the input signal V_IN, subtract the feedback signal V_FB from the input signal V_IN, and produce a delta signal expressed as V_IN−V_FB. The sigma circuit 804, coupled between the subtractor 802 and the multi-bit quantizer 806, performs an operation on the delta signal. The sigma circuit 804 may include at least one integrator, which may accumulate the information carried in the input signal V_IN. The multi-bit quantizer 806 may generate the output signal V_OUT based on the information provided from the sigma circuit 804. The output signal V_OUT generated by the multi-bit quantizer 806 may be quantized to have more than two levels. For example, if the multi-bit quantizer 806 is a 2-bit quantizer, the output signal V_OUT may have four levels; if the multi-bit quantizer 806 is a 3-bit quantizer, the output signal V_OUT may have eight levels. In general, an N-bit quantizer may be used to generate the output signal V_OUT having $2^N$ levels, where N may be any positive integer greater than 1.

In the embodiments of the present invention, there are various implementations of the sigma circuit 804 applicable to the SDM encoder 80. For example, the sigma circuit 804 may perform an $L^{th}$-order sigma-delta operation where L may be any possible positive integer. As for a higher order filter, the transfer function may be modified to overcome the stability problem, and $H_x$ may represent any appropriate transfer function under the stability issue.

Figure 9A:
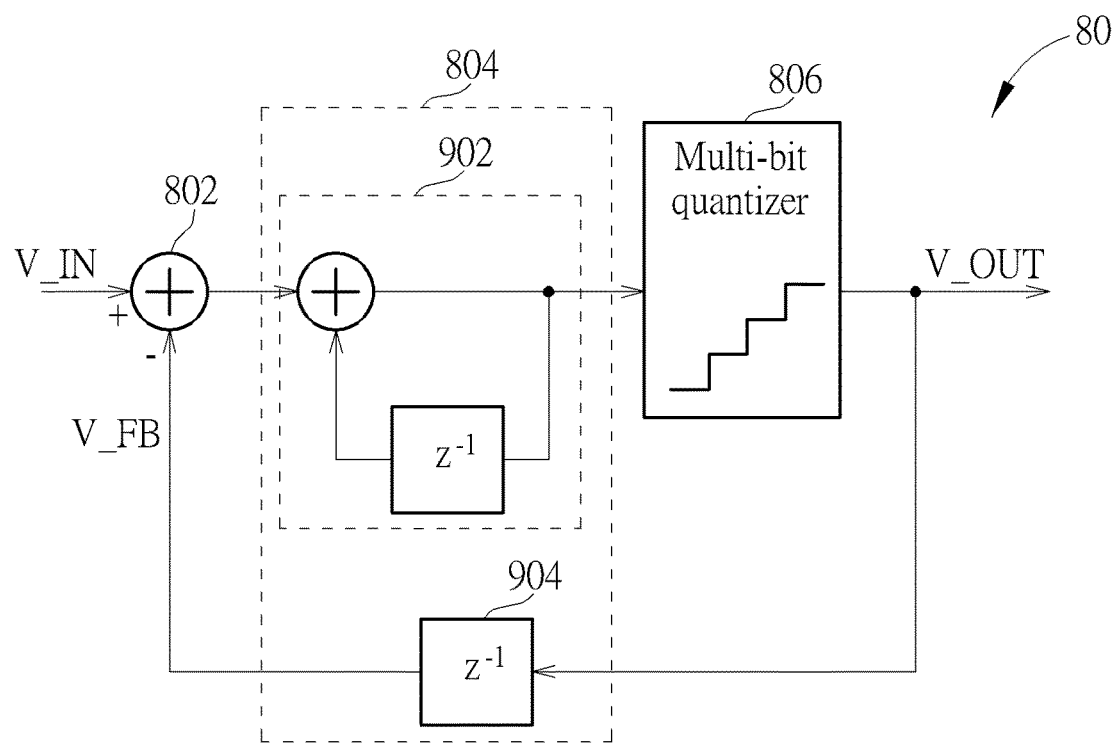
FIGS. 9A and 9B illustrate the SDM encoder performing the $1^{st}$-order sigma-delta operation.
Figure 9B:
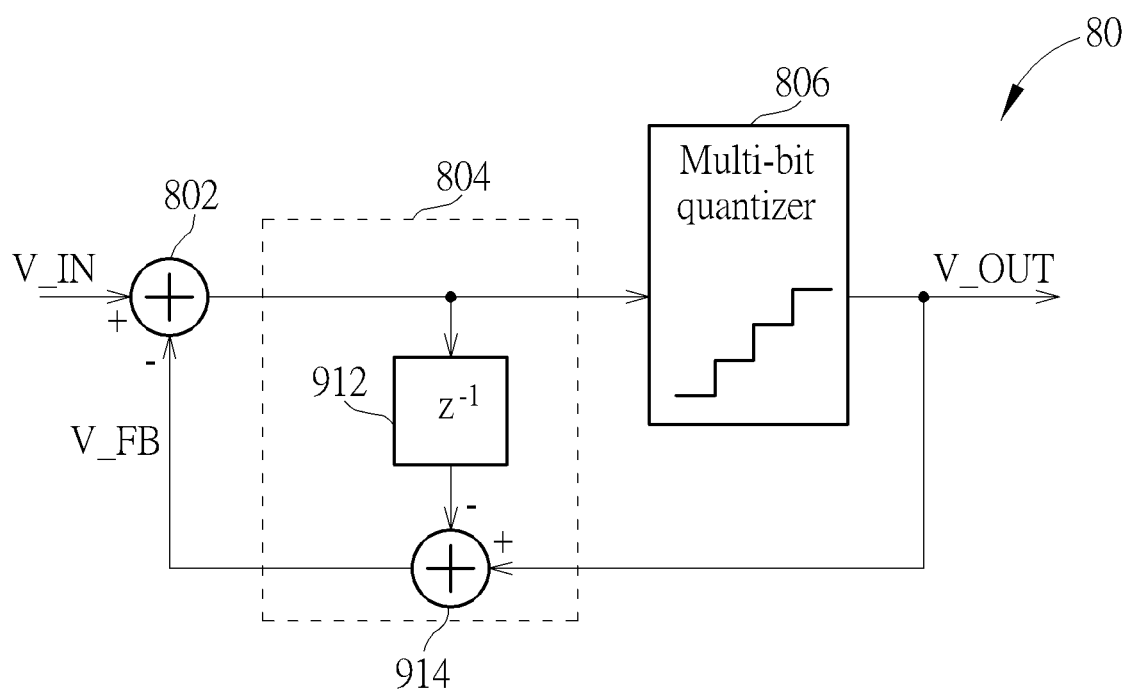

FIGS. 9A and 9B illustrate the SDM encoder 80 performing the $1^{st}$-order sigma-delta operation. In detail, FIG. 9A illustrates a typical $1^{st}$-order sigma-delta circuit, where the sigma circuit 804 includes an integrator 902 in the direct path (from the subtractor 802 to the multi-bit quantizer 806) and a delay element 904 in the feedback path (from the multi-bit quantizer 806 to the subtractor 802). The integrator 902, a digital integrator, coupled between the subtractor 802 and the input terminal of the multi-bit quantizer 806, may accumulate the information of the amplitude of the input signal V_IN and forward the information to the multi-bit quantizer 806. The delay element 904, coupled between the subtractor 802 and the output terminal of the multi-bit quantizer 806, may provide a unit delay to generate the feedback signal V_FB to be output to the subtractor 802. FIG. 9B illustrates an equivalent circuit of the SDM encoder 80, where in FIG. 9B the sigma circuit 804 may include a delay element 912 and a subtractor 914. The delay element 912, coupled between the subtractor 802 and the input terminal of the multi-bit quantizer 806, may provide a unit delay for the input signal V_IN. The subtractor 914, coupled between the output terminal of the multi-bit quantizer 806 and the output terminal of the delay element 912, may provide an error signal ε(n−1), which is the difference of the output signal V_OUT and the delayed input signal V_IN, as the feedback signal V_FB to be output to the subtractor 802.

The delay element of the present invention may be realized in any appropriate manner. In an embodiment, a register may be used to realize a delay element. The register may be controlled by the system clock, thereby generating a unit delay equal to one clock cycle in the delay element. In addition, in the embodiments of the present invention, an integrator may be composed of a delay element and an adder coupled in parallel, so that each input signal may be delayed and added to the subsequent input signal. The adder and subtractor are well known devices commonly used in the digital circuitry and will not be detailed herein.

Figure 10A:
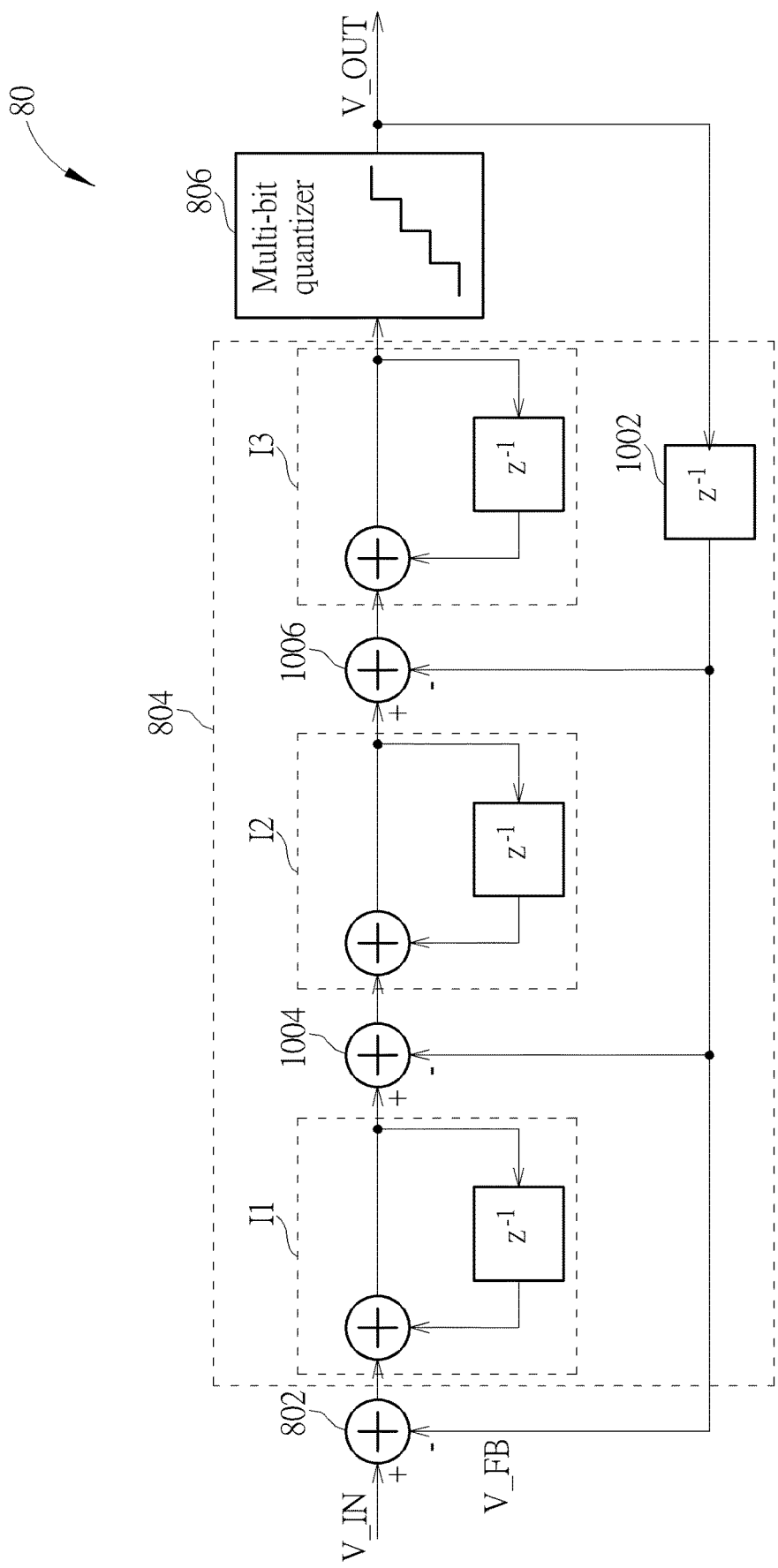
FIGS. 10A and 10B illustrate the SDM encoder performing a $3^{rd}$-order sigma-delta operation.
Figure 10B:
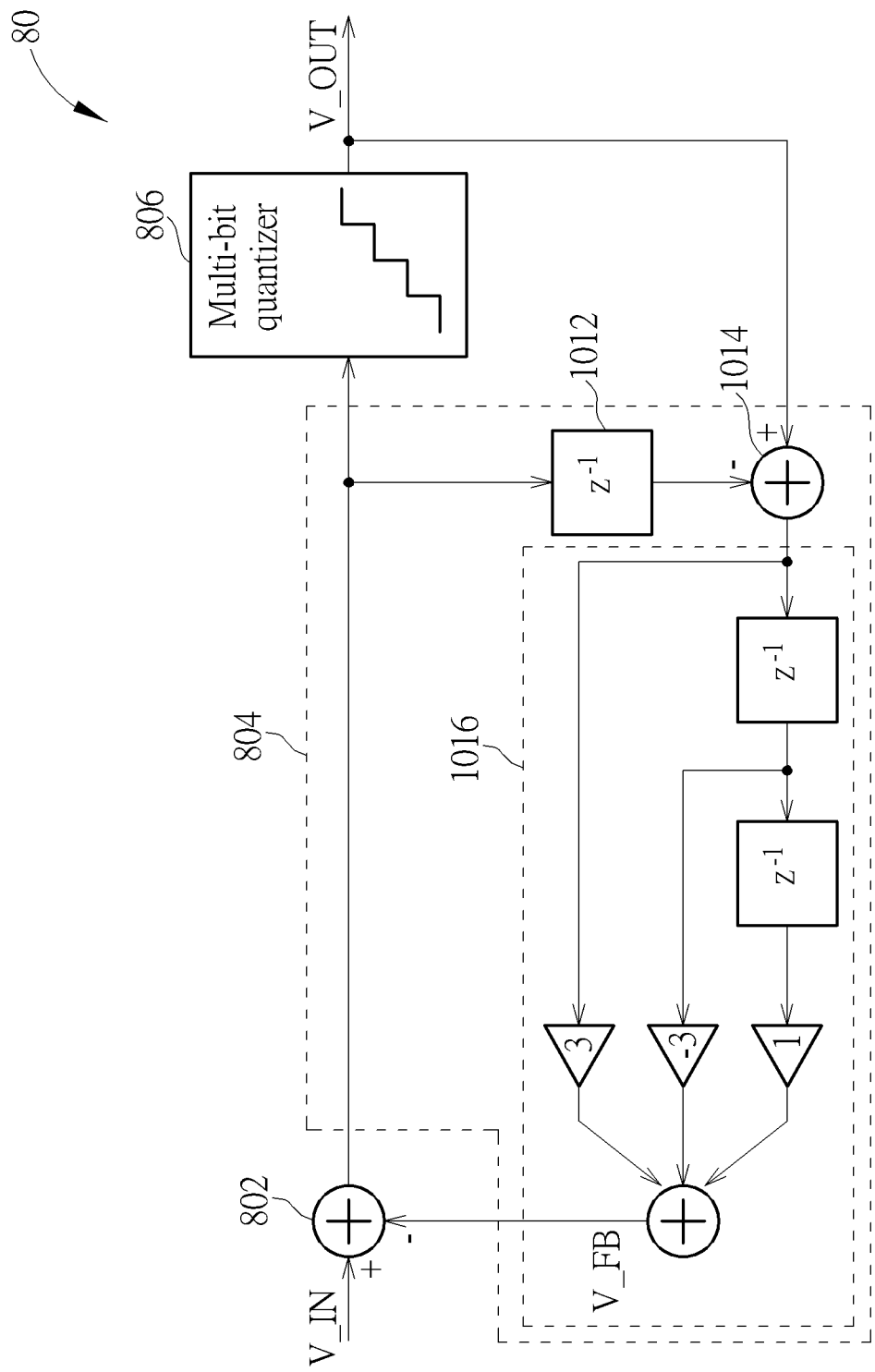

FIGS. 10A and 10B illustrate the SDM encoder 80 performing a $3^{rd}$-order sigma-delta operation. In detail, FIG. 10A illustrates a typical $3^{rd}$-order sigma-delta circuit, where the sigma circuit 804 includes a delay element 1002, subtractors 1004 and 1006, and integrators I1-I3. The delay element 1002 is implemented in the feedback path, and the subtractors 1004 and 1006 and the integrators I1-I3 are implemented in the direct path. FIG. 10B illustrates an equivalent circuit of the 3rd-order sigma circuit 804, where in FIG. 10B the sigma circuit 804 includes a delay element 1012, a subtractor 1014 and a digital filter 1016. The digital filter 1016 in conjunction with the delay element 1012 and the subtractor 1014 may generate the corresponding NTF. More specifically, the NTF of the $3^{rd}$-order SDM encoder 80 is equal to:

$$Y(z)=X(z)+(1-z^{-1})^3 E_C(z),$$

and the formula may be expanded to be:

$$Y(z)=X(z)+(1-3z^{-1}+3z^{-2}-z^{-3})E_C(z).$$

As shown in FIG. 10B, the delay elements and the multipliers of the digital filter 1016 may provide the coefficients equivalent to the NTF described above and generate the feedback signal V_FB carrying the related information, so as to realize the noise shaping/transfer function of the SDM encoder 80.

Figure 11A:
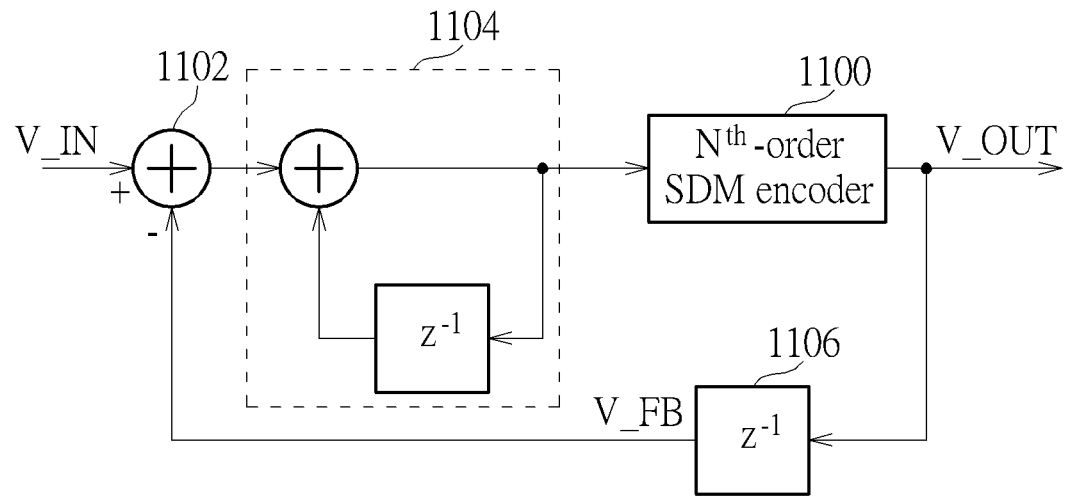
FIGS. 11A and 11B illustrate generalized implementations of an $(N+1)^{th}$-order sigma circuit and the related SDM encoder.
Figure 11B:
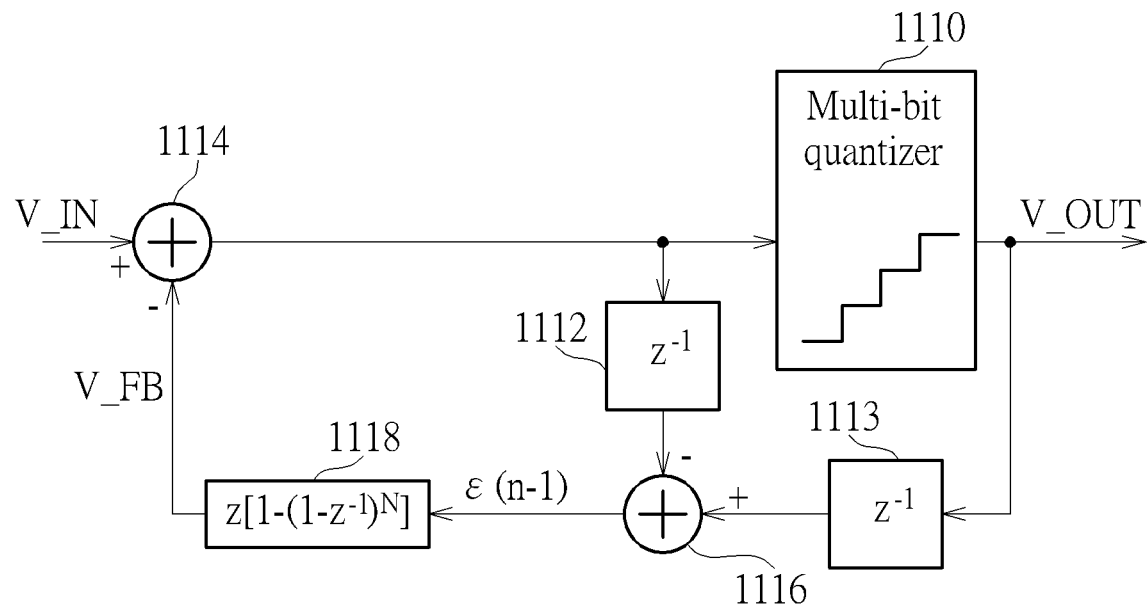

FIGS. 11A and 11B illustrate generalized implementations of an $(N+1)^{th}$-order sigma circuit and the related SDM encoder, where N may be any positive integer. In detail, FIG. 11A illustrates a typical structure of the $(N+1)^{th}$-order SDM encoder, which includes an $N^{th}$-order SDM encoder 1100 in addition to a subtractor 1102, an integrator 1104 and a delay element 1106. The $N^{th}$-order SDM encoder 1100 may include an SDM encoder performing an $N^{th}$-order sigma-delta operation and a multi-bit quantizer as described above, and the additional integrator 1104 and delay element 1106 are included to realize the $(N+1)^{th}$-order sigma-delta circuit. FIG. 11B illustrates an equivalent circuit of the $(N+1)^{th}$-order sigma circuit and the related SDM encoder, which includes a multi-bit quantizer 1110, delay elements 1112 and 1113, subtractors 1114 and 1116, and a digital filter 1118.

The detailed implementations and operations of the multi-bit quantizer 1110, the delay elements 1112 and 1113, and the subtractors 1114 and 1116 are similar to those of the multi-bit quantizer 806, the delay element 1012, and the subtractors 802 and 1014 as shown in FIG. 10B, and will not be narrated herein. The digital filter 1118, which is configured to receive an error signal ε(n−1) from the subtractor 1116 and correspondingly output the feedback signal V_FB to the subtractor 1114, may include any appropriate circuit elements capable of generating the transfer function $z[1-(1-z^{-1})^N]$. Under the feedback control of the digital filter 1118, the STF and NTF of the $(N+1)^{th}$-order SDM encoder may be achieved.

Figure 12:
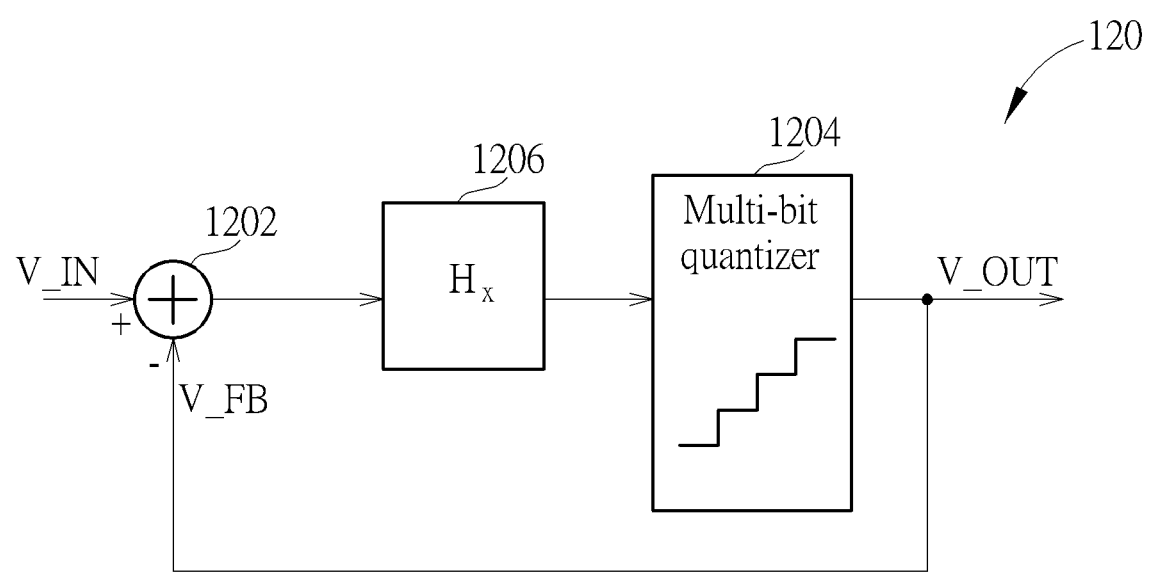
FIG. 12 is a schematic diagram of an SDM encoder according to an embodiment of the present invention.

As mentioned above, the transfer functions of the sigma circuit may further be modified to solve the stability problem of the high-order sigma-delta circuit. The related implementations may also be combined with a multi-bit quantizer to realize the SDM encoder of the present invention. Please refer to FIG. 12, which is a schematic diagram of an SDM encoder 120 according to an embodiment of the present invention. As shown in FIG. 12, the SDM encoder 120 includes a subtractor 1202, a multi-bit quantizer 1204 and a digital filter 1206. The detailed implementations and operations of the subtractor 1202 and the multi-bit quantizer 1204 are similar to those described in the above paragraphs and will not be narrated herein. The digital filter 1206, coupled between the subtractor 1202 and the input terminal of the multi-bit quantizer 1204, may include any appropriate circuit elements used for realizing a sigma circuit in any order while maintaining the system stability. In an embodiment, a Butterworth high-pass filter may be utilized to filter the noises. The stability improvement may be achieved for an $N^{th}$-order SDM encoder especially when N is greater than or equal to 3.

More specifically, in order to improve the stability and achieve the noise shaping function, the NTF of the SDM encoder 120 may first be determined. In an embodiment, the NTF may be (proportional to) a transfer function of a high pass Butterworth filter.

As mentioned above, the NTF is equal to $1/(1+H_x)$; hence, the determined NTF may be used to calculate the transfer function $H_x$ of the digital filter 1206. In preferable embodiments, the transfer function $H_x(z)$ of the digital filter 1206 may be designed as shown in Table 1, where the NTF is assumed to be $N^{th}$ order Butterworth filter (N=3, . . . , 6):

| Σ-Δ order | $H_x(z)$ |
|---|---|
| 3 | $H_{x3}(z) = \dfrac{1.54017z^{-1} - 2.08883z^{-2} - 0.80217z^{-3}}{1 - 2.99920z^{-1} + 2.99920z^{-2} - z^{-3}}$ |
| 4 | $H_{x4}(z) = \dfrac{0.80465z^{-1} - 2.10650z^{-2} + 1.86395z^{-3} - 0.55594z^{-4}}{1 - 3.99828z^{-1} + 5.99656z^{-2} - 3.99828z^{-3} + z^{-4}}$ |
| 5 | $H_{x5}(z) = \dfrac{0.80633z^{-1} - 2.91044z^{-2} + 3.96761z^{-3} - 2.41900z^{-4} + 0.55615z^{-5}}{1 - 4.99732z^{-1} + 9.99197z^{-2} - 9.99197z^{-3} + 4.99732z^{-4} - z^{-5}}$ |
| 6 | $H_{x6}(z) = \dfrac{0.80720z^{-1} - 3.71736z^{-2} + 6.87653z^{-3} - 6.38487z^{-4} + 2.97478z^{-5} - 0.55623}{1 - 5.99693z^{-1} + 14.98774z^{-2} - 19.98161z^{-3} + 14.98774z^{-4} - 5.99693z^{-5} +}$ |

Note that similar calculations for obtaining the transfer function $H_x(z)$ may be applied to the sigma-delta circuit with an order higher than 6, and the related calculation ways and results are omitted herein for brevity.

Figure 13:
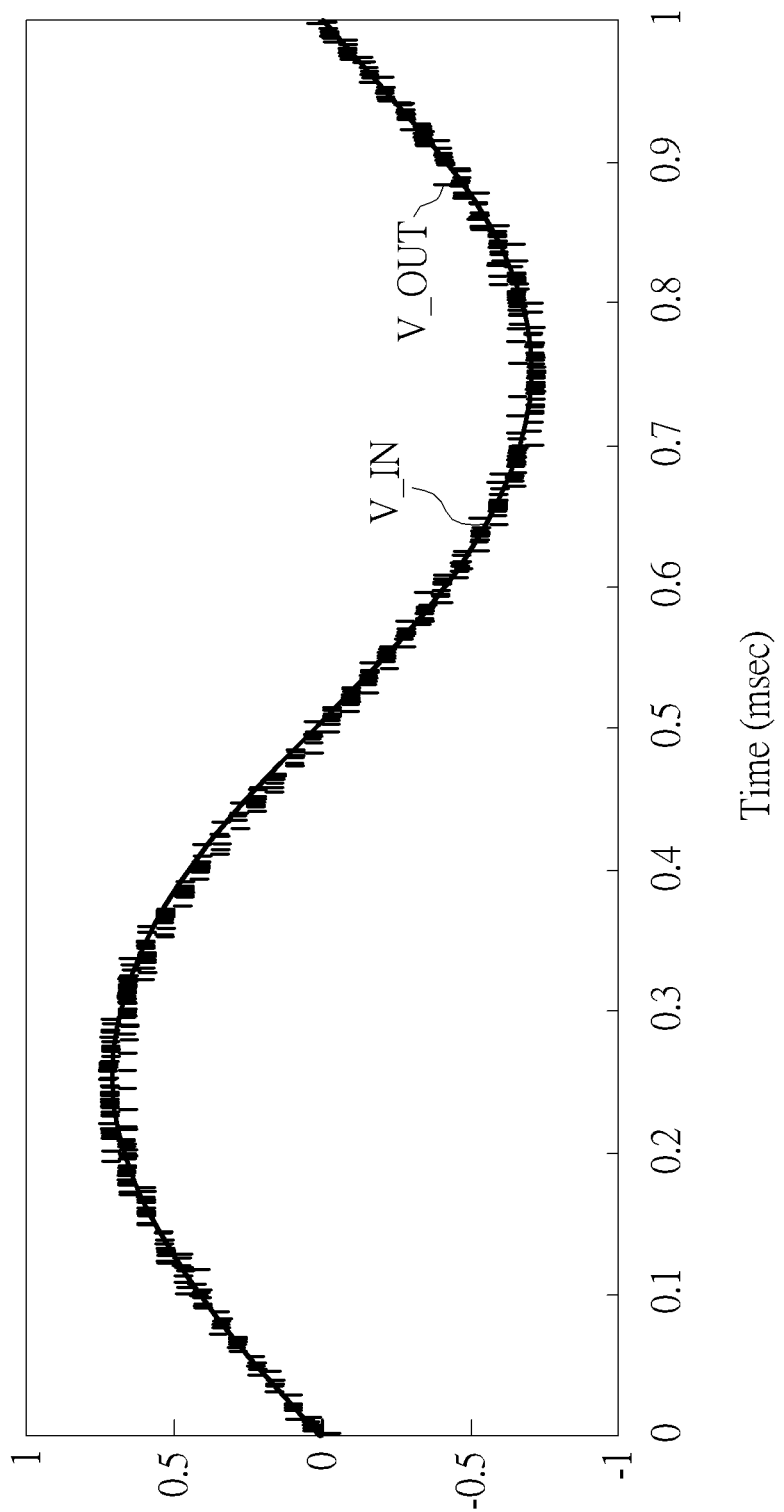
FIG. 13 is a waveform diagram of the SDM encoder according to an embodiment of the present invention.

Please refer to FIG. 13, which is a waveform diagram of the SDM encoder according to an embodiment of the present invention. FIG. 13 illustrates the input signal V_IN and the output signal V_OUT of the SDM encoder. The SDM encoder applies a 5-bit quantizer, so that the output signal V_OUT has 32 levels. As shown in FIG. 13, the output signal V_OUT falls on one of the 32 levels in each cycle and follows the input signal V_IN based on the operations of the sigma circuit.

Figure 14:
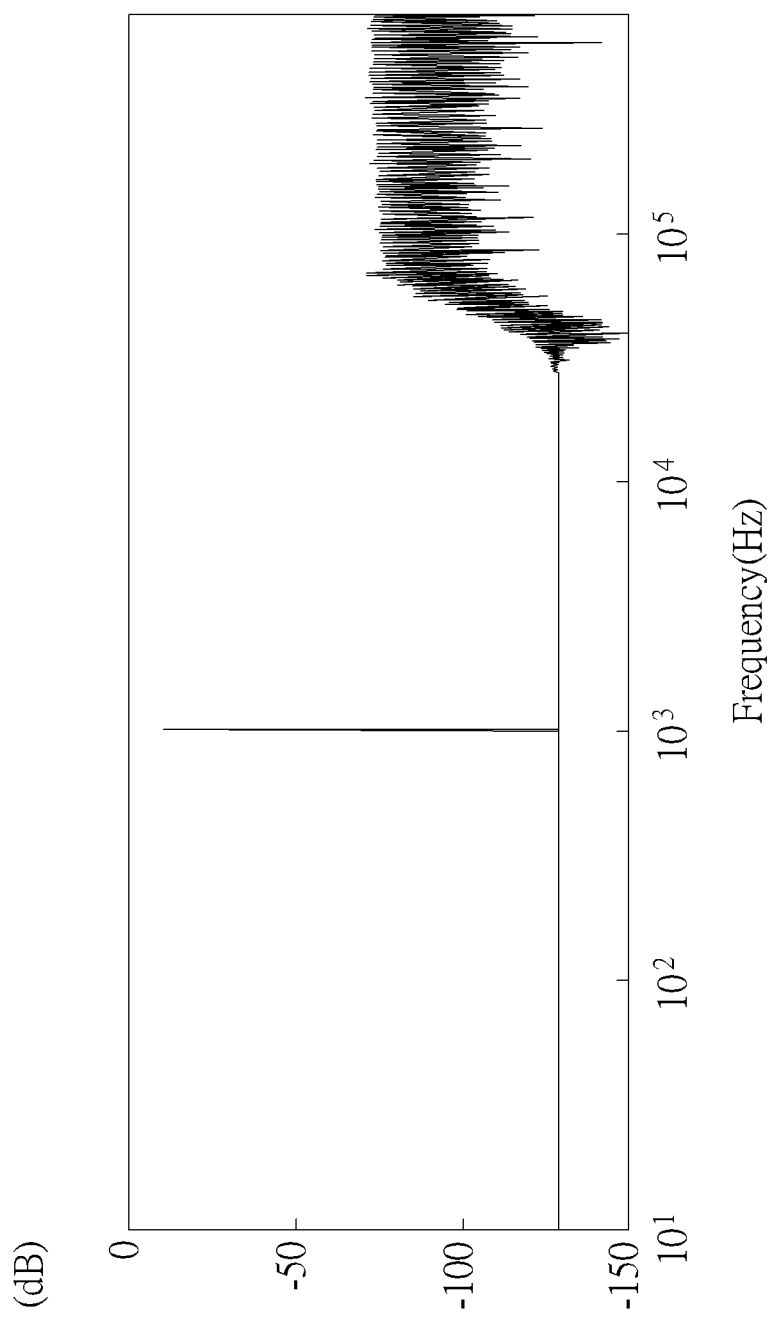
FIG. 14 is a schematic diagram of the frequency spectrum of a sinusoidal signal encoded as an SDM.

In this embodiment, the input signal V_IN is a 1-tone sinusoidal signal in 1 kHz, and PCM (pulse-code modulation) coded, where the sample rate is 1.536 MHz, as a high oversample rate. FIG. 14 is a schematic diagram of the frequency spectrum of this SDM encoded signal. As shown in FIG. 14, the signal spectrum in the audible frequency range, from 20 Hz to 20 kHz, is quite clean, and the noises are shifted to higher frequencies. With the usage of the 5-bit quantizer, when the SDM encoder applies an $8^{th}$-order sigma circuit, the simulation result indicates that the SQNR is approximately equal to 137 dB. In comparison, under the same sample rate 1.536 MHz, a PCM circuit needs to apply a 20-bit configuration to achieve identical SQNR.

Please note that the $8^{th}$-order sigma-delta filter is feasible based on the design technique for improving the system stability as described above. On the other hand, the 20-bit resolution for the PCM circuit requires more bits to achieve desired resolution. Based on the SDM encoder of the present invention, 5-bit resolution with the $8^{th}$-order sigma circuit is enough to achieve a satisfactory SQNR. With the usage of the same bit number and the same sample rate, the SDM circuit/encoder of the present invention can achieve a better SQNR as compared to other conventional modulation schemes. In another perspective, to achieve certain resolution or SQNR, SDM-based encoding scheme (via the SDM encoder in the above) reduces number of bits significantly.

In addition, the SDM encoder allows the output signal to rise and fall following the level of the input signal. In contrast to the PDM circuit where the output signal is composed of pulses swinging between only two levels, the SDM encoded signal does not have such high swing at such high-frequency like/as PDM does. Therefore, the power consumption for driving the capacitive load may be substantially saved/reduced.

In short, the advantages of the SDM-based encoding scheme via the SDM encoder in the above is reducing number of bits for certain resolution (which is advantage over PCM scheme) and reducing power consumption while operating (which is advantage over PDM scheme).

Preferably, an at least 4-bit quantizer is used, where the output signals have at least 16 levels. The increasing bit number of the quantizer may also lead to increasing SQNR. In addition, the increasing order of the sigma circuit may also lead to increasing SQNR based on the enhanced noise shaping capability.

Figure 15:
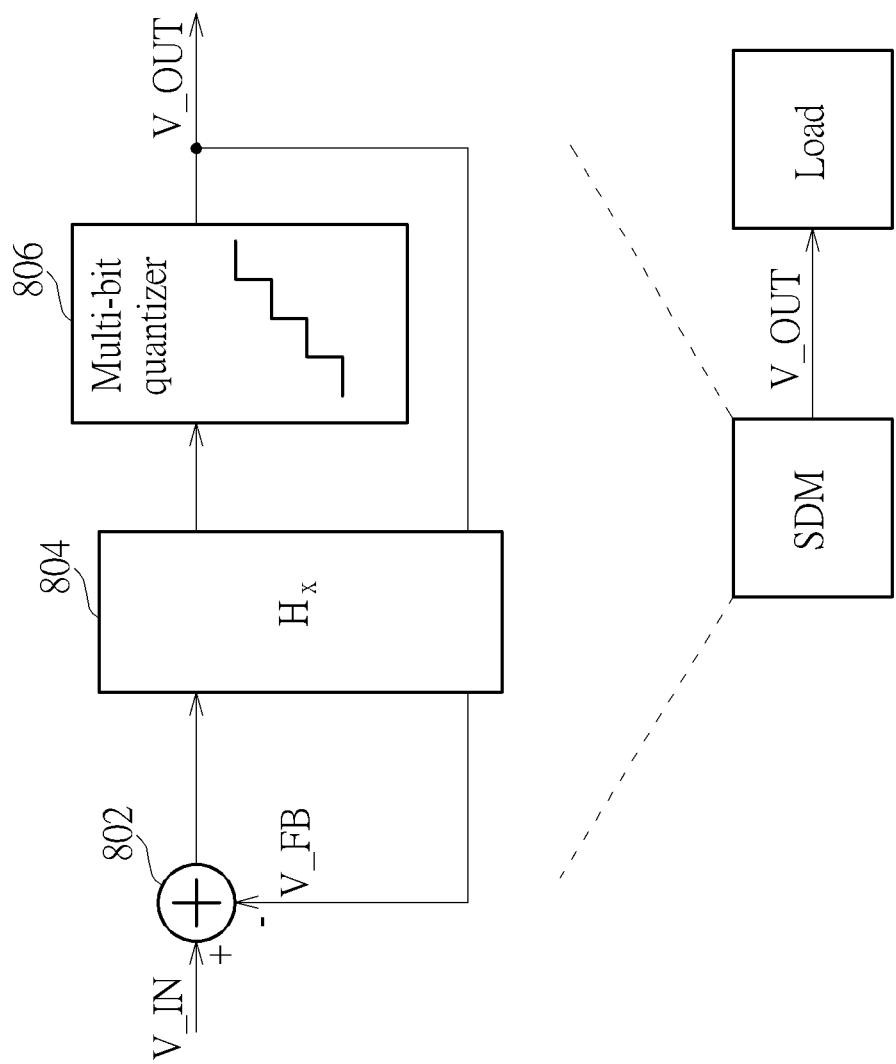
FIG. 15 is a schematic diagram of an SDM encoder coupled to a load.

The SDM encoder of the present invention has various applications. Please refer to FIG. 15, which is a schematic diagram of an SDM encoder coupled to a load, where the SDM encoder is configured to output the output signal V_OUT to the load. The term "coupled to" in the present invention may refer to direct or indirect connection. For example, a device A being coupled to a device B may refer that the device A is directly connect to a device B, or the device A is indirectly connected to the device B via some component C.

A load quantity of the load may have a memory property (e.g., a capacitive load) or a memoryless property (e.g., a non-capacity load). The load quantity having memory property represents that a load quantity produced by the load corresponding to a specific time t is dependent on the load quantity corresponding to time before the specific time (e.g., $t-t_0$ with $t_0>0$). The load quantity having memoryless property represents that a load quantity produced by the load corresponding to a specific time t is independent of the load quantity corresponding to time before the specific time (e.g., $t-t_0$ for some $t_0>0$).

The load quantity is not limited. When the SDM encoder is applied to control another circuit (e.g., amplifier), the load quantity may be voltage or electric current. When the SDM encoder is applied to control a robotic arm, the load quantity may be mechanic torque or an angle rotated. When the SDM encoder is applied to control a thermal-processed or thermal-related equipment, the load quantity may be thermal energy or temperature.

In an embodiment, the SDM encoder may be applied in a digital sound reconstruction (DSR) system. The DSR system may include multiple sound generating cells, a.k.a. sound generating dots (SGDs), where each SGD may be a micro-electromechanical system (MEMS) device capable of making sounds by receiving (digitized) electrical signals and operating in a switch mode.

The digitized electrical signal may control the SGD to be ON (e.g., being actuated herein) or OFF (e.g., being not actuated herein), so as to reconstruct sound. Details of typical DSR system and SGD are known in the art, which can be referred to A. Arevalo, et al, "Towards a digital sound reconstruction MEMS device: Characterization of a single PZT based piezoelectric actuator," Proceedings of the 10th IEEE International Conference on Nano/Micro Engineered and Molecular Systems (IEEE-NEMS 2015) Xi'an, China, Apr. 7-11, 2015, for reference.

In the present invention, a device operating in a switch mode may represent that an operation of the device is performed via (constantly) switching the device in a certain way, or the operation of the device is performed in a discrete-time fashion/manner. Take SGD as an example, while reconstructing sound, the SGD is (constantly) switched between ON status or OFF status. The SGD is actuated in the ON status and the SGD is not actuated in the OFF status. Or, input for the SGD is a discrete-time signal.

Figure 16:
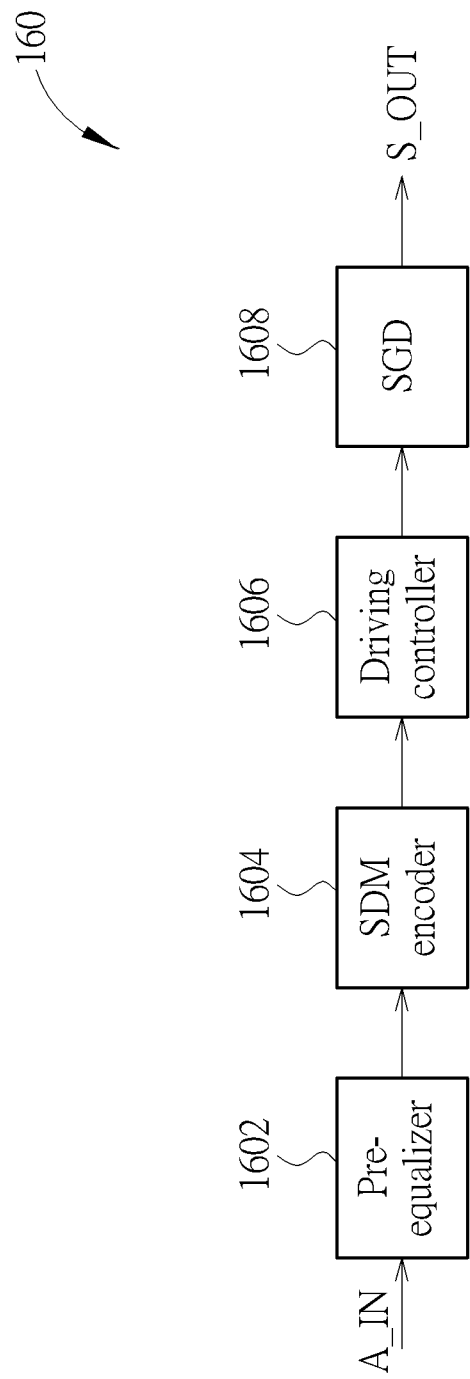
FIG. 16 is a schematic diagram of an embodiment of the SDM encoder applied in a DSR system.

Please refer to FIG. 16, which is a schematic diagram of an embodiment of the SDM encoder applied in a DSR system. FIG. 16 illustrates an audio DSR system 160, which includes a pre-equalizer 1602, an SDM encoder 1604, a driving controller 1606 and an SGD component 1608. The audio DSR system 160 is configured to receive an audio input signal A_IN and correspondingly generate a sound output signal S_OUT. The SGD component 1608 may comprise a plurality of (or an array of) sound generating cells. The SDM encoder 1604 may shift the noises to higher frequencies, so as to achieve a higher SQNR. The driving controller 1606 is configured to control the operations of the SGD component 1608 based on the signals received from the SDM encoder 1604. The SGD component 1608 thereby outputs the sound output signal S_OUT with a high SQNR.

Please note that the SGD component 1608 has a feature that the frequency response thereof is proportional to the frequency f. Therefore, a high-frequency sound may be louder and a low-frequency sound may be lower as the signal passes through the SGD component 1608. In order to solve this problem, the pre-equalizer 1602 may be deployed in the audio system 160, e.g., prior to the SDM encoder 1604. The pre-equalizer 1602 may amplify the signals in lower frequencies and reduce the signals in higher frequencies, so as to compensate for the frequency response of the SGD component 1608. In an embodiment, the pre-equalizer 1602 may comprise an integrator to perform an integration operation. The integration operation (or integrator) has a feature that the frequency response thereof is proportional to 1/f, an inverse (reciprocal) of the frequency f, and may provide similar effects to amplify the lower-frequency signals and reduce the higher-frequency signals, thereby compensating for the frequency response of the SGD component 1608.

Figure 22:
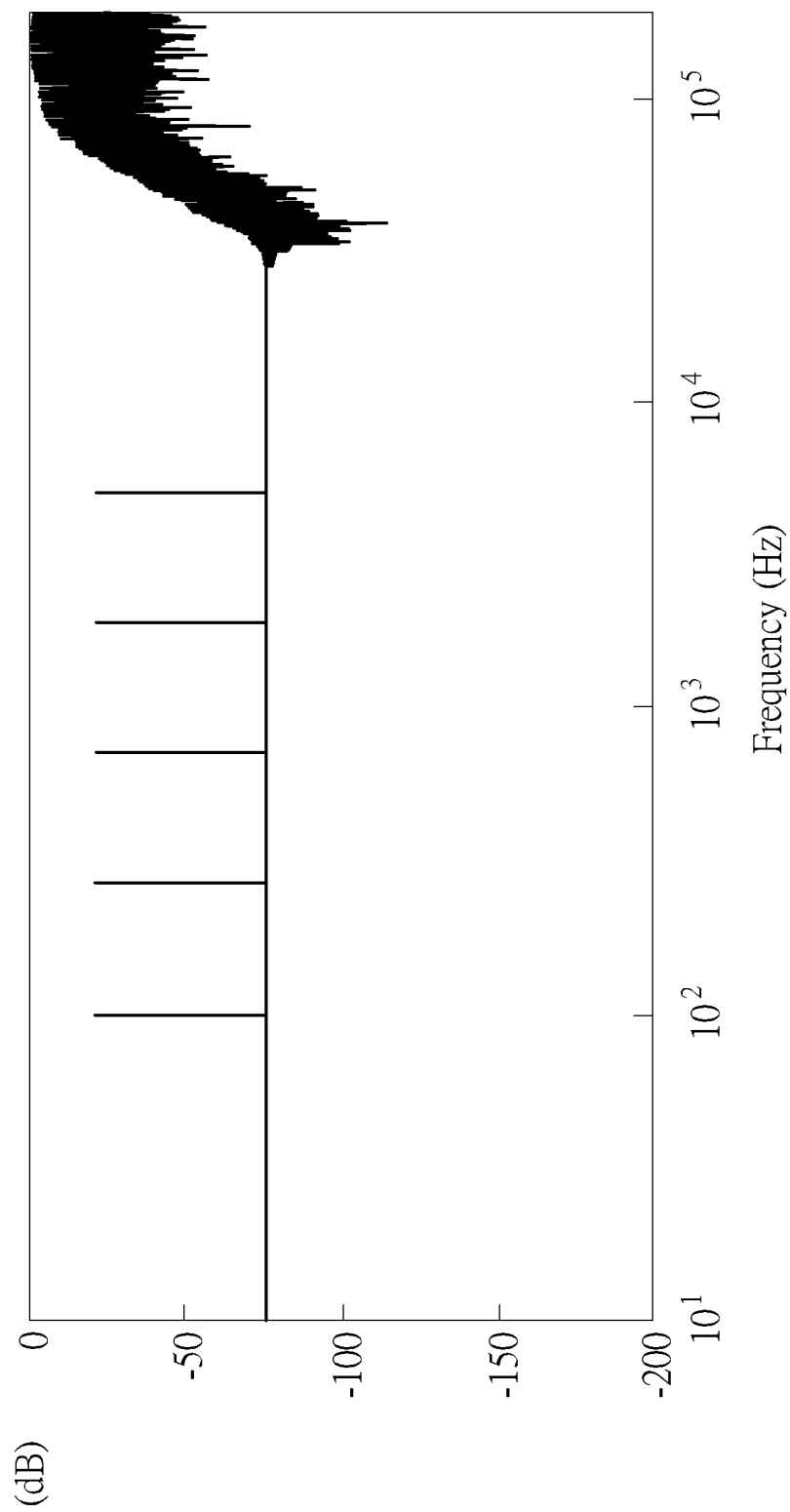
FIG. 22 illustrates spectrum analysis of the sound output signal of the audio DSR system.

FIG. 22 illustrates spectrum analysis of the sound output signal S_OUT of the audio DSR system 160, where the scheme of the SDM encoder 120, along with 8th order and 6-bit quantizer (64 levels), is used for the SDM encoder 1604. The SDM encoder 1604 operates at a sample rate as 384 kilo-sample-per-second (ksps). The audio input signal A_IN is a composition of five equal-weighted and equal-spaced single-tone signals. As can be seen from FIG. 22, the DSR system 160 is able to nicely reconstruct the audio input signal A_IN, with a 90.2 dB SNDR (signal-to-noise/distortion ratio) been achieved. By exploiting the SDM encoder, only 6 bits is needed to achieve such precision.

Please refer back to FIG. 15. In another embodiment, the load may be a capacitive load. The capacitive load may have an integration effect, where the (output) load quantity of corresponding to previous time $t-t_0$ may be accumulated or integrated (over different $t_0$). For example, as for a capacitor included in the load, the current signals received by the capacitor may be considered as electric charges accumulated in the capacitor.

In an embodiment, the SDM encoder may be coupled to a switching mode amplifier. The switching mode amplifier may be configured to drive a capacitive load, a load with capacitance, e.g., a capacitive (MEMS fabricated or piezoelectric actuated) speaker load, and may represent that the operations thereof may be performed via switching between a charging phase or a discharging phase, or be performed via switching between an InFlux phase (magnetic flux-increasing phase) and a DeFlux phase (magnetic flux-decreasing phase).

For example, in the charging phase, the audio signal may increase and the amplifier may charge the capacitive speaker load. On the other hand, in the discharging phase, the audio signal may decrease, and the amplifier may discharge the capacity speaker load.

The switch mode amplifier in the present invention may refer to class-D amplifier known in the art or class-X amplifier disclosed by applicant of the present invention, but not limited thereto. Class-X amplifier is a kind of switch mode amplifier which diverts a current in a current direction from the (capacitive) load back to (capacitance within) the voltage source during the discharging phase, such that electric/magnetic energy can be reused/recycled in the subsequent charging cycles.

Details of class-X amplifier may be referred to topologies of the driving circuits disclosed in U.S. application Ser. No. 17/022,106, Ser. No. 17/352,346 and/or Ser. No. 17/380, 027, which are omitted herein for brevity. In short, the amplifier (or driving circuit) in Ser. No. 17/022,106 comprises a buck convert and a boost convert, and both of them belong to a category of direct-current-to-direct-current (DC-DC) converters. The amplifier (or bidirectional circuit) in Ser. No. 17/352,346 comprises a four-transistor bidirectional DC-DC converter.

Figure 17:
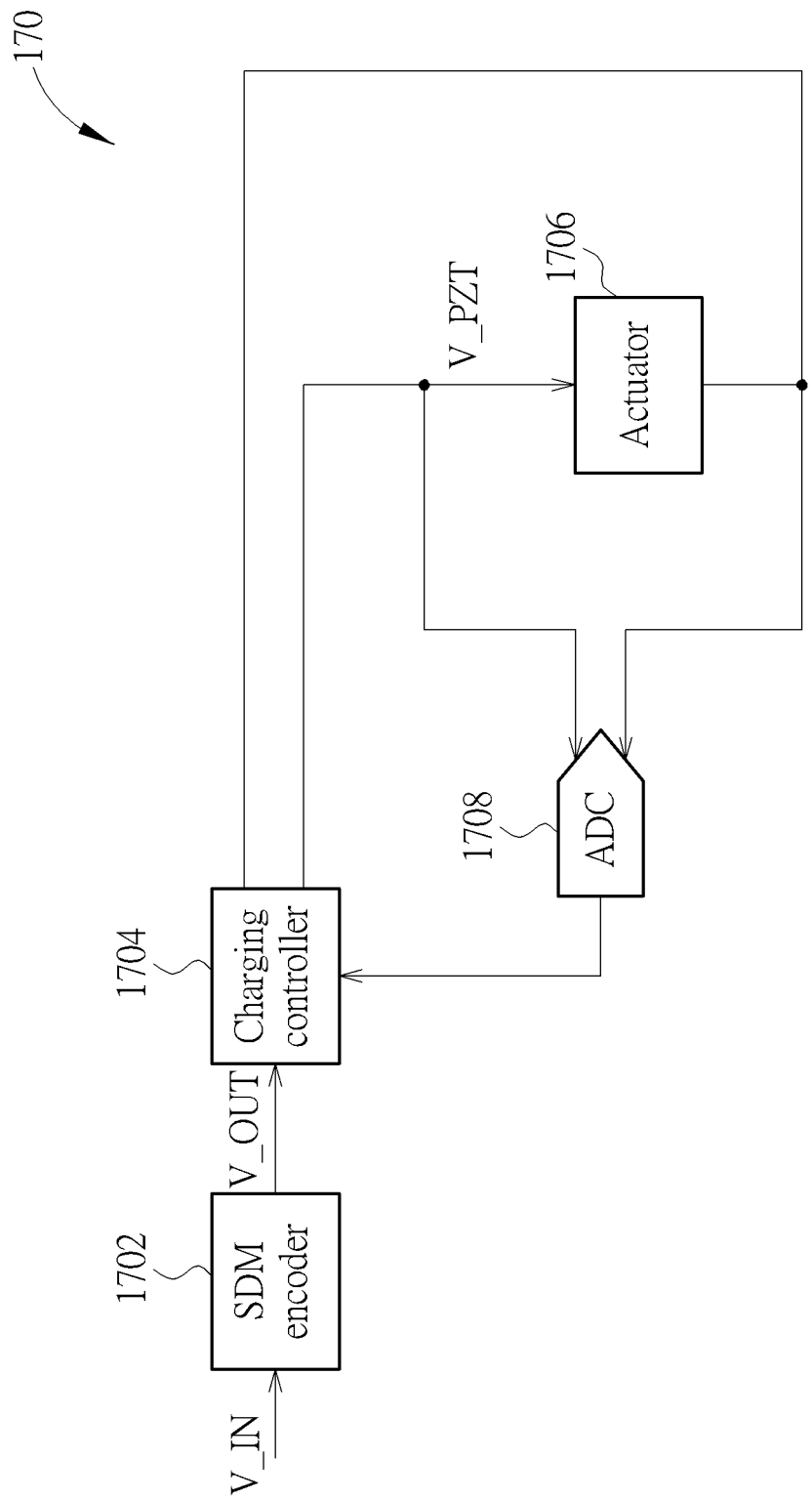
FIG. 17 illustrates an audio system.

Please refer to FIG. 17, which illustrates an audio system 170. The audio system 170 includes an SDM encoder 1702, a charging controller 1704, an actuator 1706 and an analog-to-digital converter (ADC) 1708. The charging controller 1704 may comprise switch mode amplifier stated above, e.g., the class-X amplifier or driving circuit disclosed in Ser. Nos. 17/022,106, 17/352,346 and/or 17/380,027. The actuator 1706 may be disposed on a sound producing membrane within a sound producing device. The actuator 1706 may comprise a piezoelectric material/layer sandwiched between two electrodes, and a voltage (or signal) across between the two electrodes is denoted as V_PZT. Due to characteristic of the piezoelectric material, the actuator 1706 may be regarded as a capacitive load. As known in the art, by applying V_PZT on the actuator 1706, the actuator 1706 may be deformed to generate sounds or acoustic wave.

The charging controller 1704, as the switch mode amplifier, injects current into the capacitive load during the charging phase and drains current from the capacitive load during the discharging phase, such that sound produced by the audio system 170 reflects the signal V_IN or V_OUT, where the capacitive load is represented by the actuator 1706. V_OUT may be viewed as the input signal IN for the driving circuit disclosed in Ser. Nos. 17/022,106, 17/352, 346 and/or 17/380,027. In addition, the ADC 1708 is used to convert the feedback signal to the digital form to facilitate the feedback control for the class-X amplifier.

In another perspective (with respect to the SDM encoder 1702), the charging controller 1704 may be viewed as a load of the SDM encoder 1702. The load quantity of the charging controller 1704 may have memory property or memoryless property, depending on which quantity is referred to. Suppose that the charging controller 1704 comprises the switch mode amplifier or the driving circuit of Ser. Nos. 17/022, 106, 17/352,346 and/or 17/380,027. When a first load quantity is a current (injected to or drained from the capacitive load) produced by the charging controller 1704 within a switching cycle, the first load quantity has memoryless property. On the other hand, when a second load quantity is an amount of electric charges Q (in unit of coulomb) stored in the capacitive load represented by the actuator 1706 or the voltage V_PZT applied across the electrodes within the actuator 1706, resulted by the charging controller 1704, the second load quantity has memory property.

Figure 23:
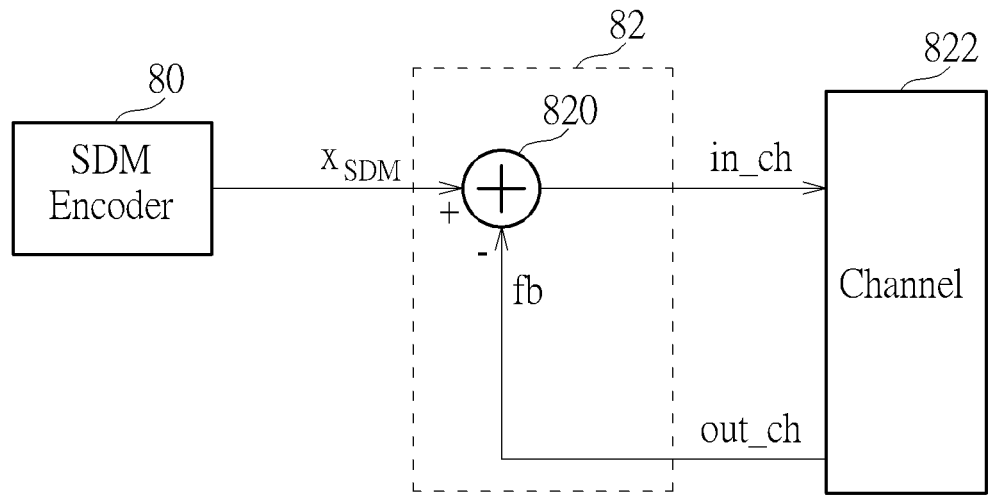
FIG. 23 illustrates a schematic diagram of the SDM encoder coupled to a system.

In addition, FIG. 23 illustrates a schematic diagram of the SDM encoder 80 coupled to a system 82 with a feedback control loop. The system 82 generates a channel input in_ch to be applied to/on the channel 822 and receives a channel output out_ch from the channel 822. The system 82 generates a feedback signal fb according to the channel output out_ch. The system 82 comprises a subtractor 820 to receive an output signal, denoted as $x_{SDM}$ herein, generated by/from the SDM encoder 80. The subtractor 820 subtracts the feedback signal fb from the signal $x_{SDM}$, and generates the channel input in_ch according to the subtraction result ($x_{SDM}$-fb) generated by the subtractor 820. Herein, the channel 822, to/on which the system applies, may be also interpreted as the load stated above, which may be speaker load, mechanic robotic arm or thermal-related equipment, but not limited thereto.

Note that, enhancement of the resolution of the signal $x_{SDM}$ brought by the feature of SDM would also enhance the resolution of the overall system including the SDM encoder 80, the system 82 along with the channel 822. That is, exploiting the SDM encoder would improve the overall system performance, especially in terms of control precision/resolution.

In FIG. 23, a time delay between the channel input in_ch and the channel output out_ch may be negligible or there may be no time delay between the channel input in_ch and the channel output out_ch, which is not limited thereto.

Figure 24:
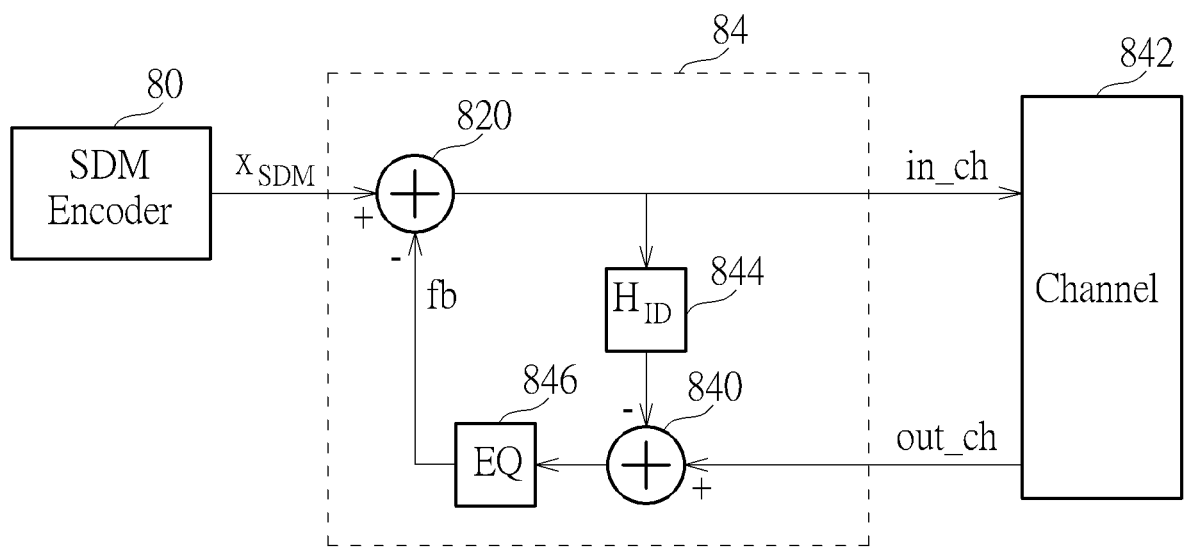
FIG. 24 illustrates a schematic diagram of the SDM encoder coupled to a system.

For example, FIG. 24 illustrates a schematic diagram of the SDM encoder 80 coupled to a system 84. Similarly, the system 84, receiving the signal $x_{SDM}$ as its input, also applies for/on a channel 842. In FIG. 24, a time delay of the channel 842 (i.e., between the channel input in_ch and the channel output out_ch shown in FIG. 24) may be discernible or perceptible, and system operation/performance may be affected due to that time delay. In this case, the system 84 may comprise a subtractor 840, an identification filter 844 and an equalizer 846. The identification filter 844 is to identify a response (or transfer function) of the channel 842, and to obtain a transfer function $H_{ID}$.

As mentioned above, the sigma circuit of the present invention is capable of shifting the noises to higher frequencies, so as to reduce the noises in the audible frequency range. The noise shaping capability may be used to deal with the quantization noises generated by the multi-bit quantizer of the SDM encoder. Please note that the applications of the sigma circuit should not be limited thereto. In another embodiment, the sigma circuit may be used to deal with any type of noises and/or distortions.

Figure 18:
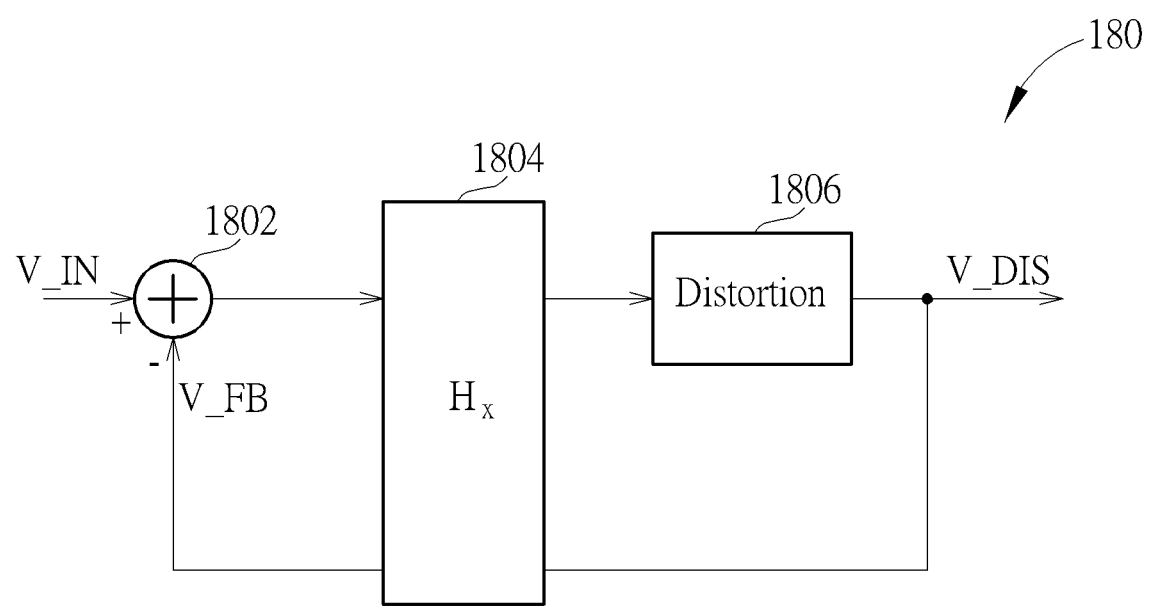
FIG. 18 is a schematic diagram of a signal processing system according to an embodiment of the present invention.

Please refer to FIG. 18, which is a schematic diagram of a signal processing system 180 according to an embodiment of the present invention. As shown in FIG. 18, the signal processing system 180 includes a subtractor 1802 and a sigma circuit 1804, applying on a distortion portion 1806. The implementations and operations of the subtractor 1802 and the sigma circuit 1804 may be referred to those of the subtractor 802 and the sigma circuit 804 stated in the above.

The distortion portion 1806 may or may not be a circuit. The distortion portion 1806 generates a distorted signal V_DIS. The distorted signal V_DIS, which may be considered as the output signal of the signal processing system 180, may include a (desired) signal component and a (undesired) distortion component. The sigma circuit 1804 is configured to remove a distortion energy of the distortion component within the distorted signal V_DIS to a high-frequency range (e.g., beyond an audible frequency band) while keeping/maintaining an energy of the signal component (e.g., within the audible frequency band). The distorted signal V_DIS may include any type of distortions, such as a non-linear distortion and/or soft-clipping distortion. With the implementation of the sigma circuit 1804, the distortions generated by the sigma circuit 1804 may be moved to higher frequencies, thereby improving the SNDR in the audible frequencies.

For example, as for a sinusoidal signal with non-linear distortions generated in the distorted signal V_DIS, the SNDR may be approximately 23 dB. The simulation result indicates that a 4th-order sigma circuit 1804 applied to the signal processing system 180 may generate the output signal having the SNDR equal to 100 dB.

Figure 19:
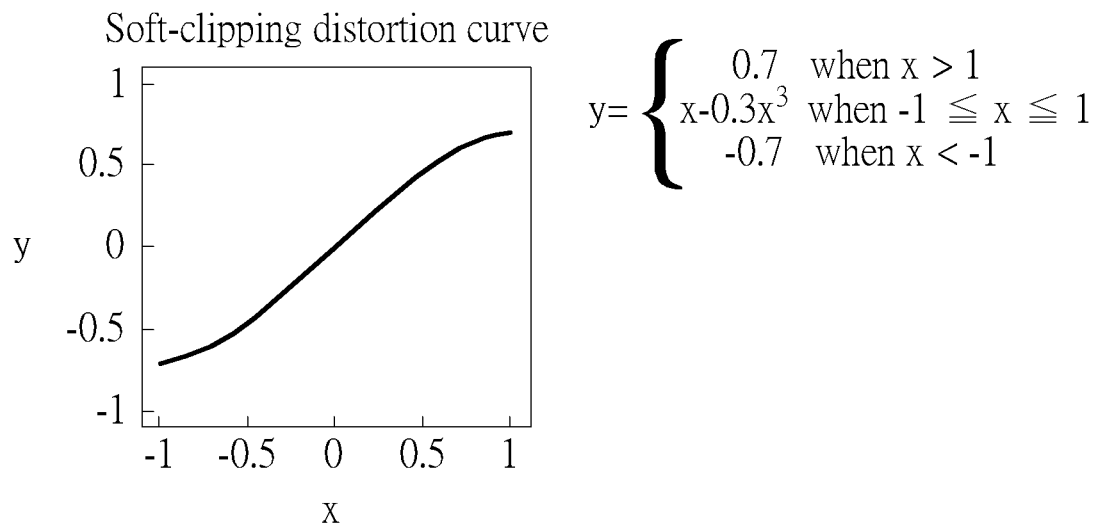
FIG. 19 illustrates an input-output relationship corresponding to the soft-clipping distortion of the distorted signal.

FIG. 19 illustrates an input-output relationship corresponding to the soft-clipping distortion of the distorted signal V_DIS. The soft clipping means that the signal variations gradually decrease near its extreme values. As shown in FIG. 19, x is the input signal of the distortion portion 1806 and y is the output signal of the distortion portion 1806 (i.e., the distorted signal V_DIS). As an example, the relation of x and y is exemplarily expressed as follows:

$$y = \begin{cases} 0.7 & \text{when } x > 1 \\ x - 0.3x^3 & \text{when } -1 \leq x \leq 1 \\ -0.7 & \text{when } x < -1 \end{cases}.$$

With the distortion generated by the distortion portion/circuit 1806, the simulation result indicates that a $4^{th}$-order sigma circuit 1804 may improve the SNDR to 101 dB from 22.9 dB. In an embodiment, the distortion portion 1806 may be a speaker, and the soft-clipping distortion may appear in the speaker where the received signal may be distorted if it tends to reach the extreme amplitude receivable by the speaker. The sigma circuit may shift this distortion to higher frequencies; hence, the sounds output by the speaker may be cleaner in the audible frequency range after processing of the sigma circuit or the signal processing system. In other words, in the signal processing system 180 as shown in FIG. 18, the distortion portion 1806 may generate a soft-clipping waveform in its output signal, and the sigma circuit 1804 is configured to deal with the soft-clipping distortion by appropriately removing the distortion toward a higher frequency band.

Figure 20:
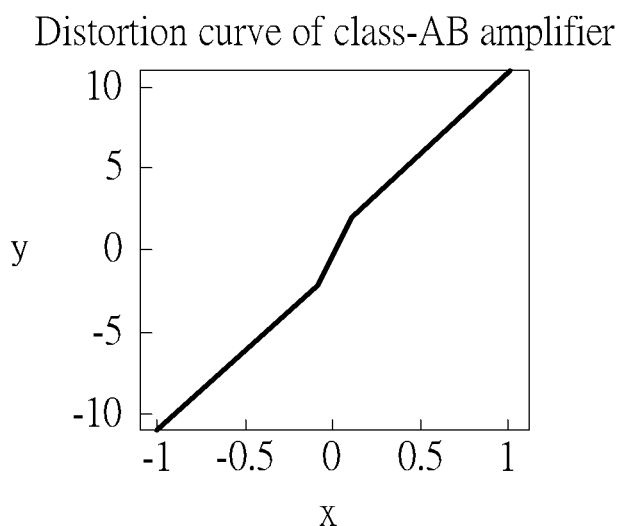
FIG. 20 is a waveform diagram illustrating the distortion generated in the class-AB amplifier.

In another embodiment, the distortion portion 1806 may be a class-AB amplifier, and the distorted signal V_DIS output by the distortion portion/circuit 1806 may include a distortion generated from the class-AB amplifier. Note that the class-AB amplifier is commonly used as the power amplifier of an audio system. Due to the diodes included in the class-AB amplifier, the distortion may be generated near the zero voltage, thereby reducing the linearity of signal amplification. FIG. 20 is a waveform diagram illustrating the distortion generated in the class-AB amplifier. Similarly, x is the input signal of the class-AB amplifier and y is the output signal of the class-AB amplifier, which may be considered as the distortion portion/circuit 1806 included in the signal processing system 180.

In such a situation, the sigma circuit 1804 is configured to deal with the distortion of the class-AB amplifier by appropriately moving the distortion to a higher frequency band. The simulation result indicates that the SNDR may be improved to 98.1 dB from 26.5 dB with the usage of the sigma circuit to perform a $4^{th}$-order sigma-delta operation.

In an embodiment/perspective, the distortion portion/circuit 1806 of the signal processing system 180 may be a multi-bit quantizer. In such a situation, the signal processing system 180 may be an SDM encoder as described in the above paragraphs, where the quantization error generated by the multi-bit quantizer may be appropriately shifted to higher frequencies by the sigma circuit 1804, thereby improving the SQNR of the output signal, as stated in the above.

Note that, the multi-bit quantizer and/or the distortion portion comprises no purely 1-bit quantizing circuit. Otherwise, it will degenerate back to PDM circuit and would not have advantages of resolution enhancement and power saving over the known PDM scheme.

In an embodiment, the input signal V_IN received by the signal processing system 180 may be a general baseband signal. Alternatively, the input signal V_IN may be a signal generated from an SDM encoder according to the present invention. Note that the implementations of the input signal V_IN should not limit the scope of the present invention.

Please note that the present invention at least aims at providing an SDM encoder and a related (signal processing) system, so as to increase the SQNR or SNDR and to enhance resolution. Those skilled in the art may make modifications and alterations accordingly. As mentioned above, in the signal processing system, various types of distortions and/or noises in the output signal may be dealt with by the sigma circuit, and they may include, but not limited to, the non-linear distortion, soft-clipping distortion, and quantization noises of the SDM encoder, PDM encoder, ADC, and/or DAC. As long as the distortions and/or noises may be moved to higher frequencies by the sigma circuit to improve the baseband SQNR and/or SNDR, the related architecture and system should belong to the scope of the present invention.

Figure 21:
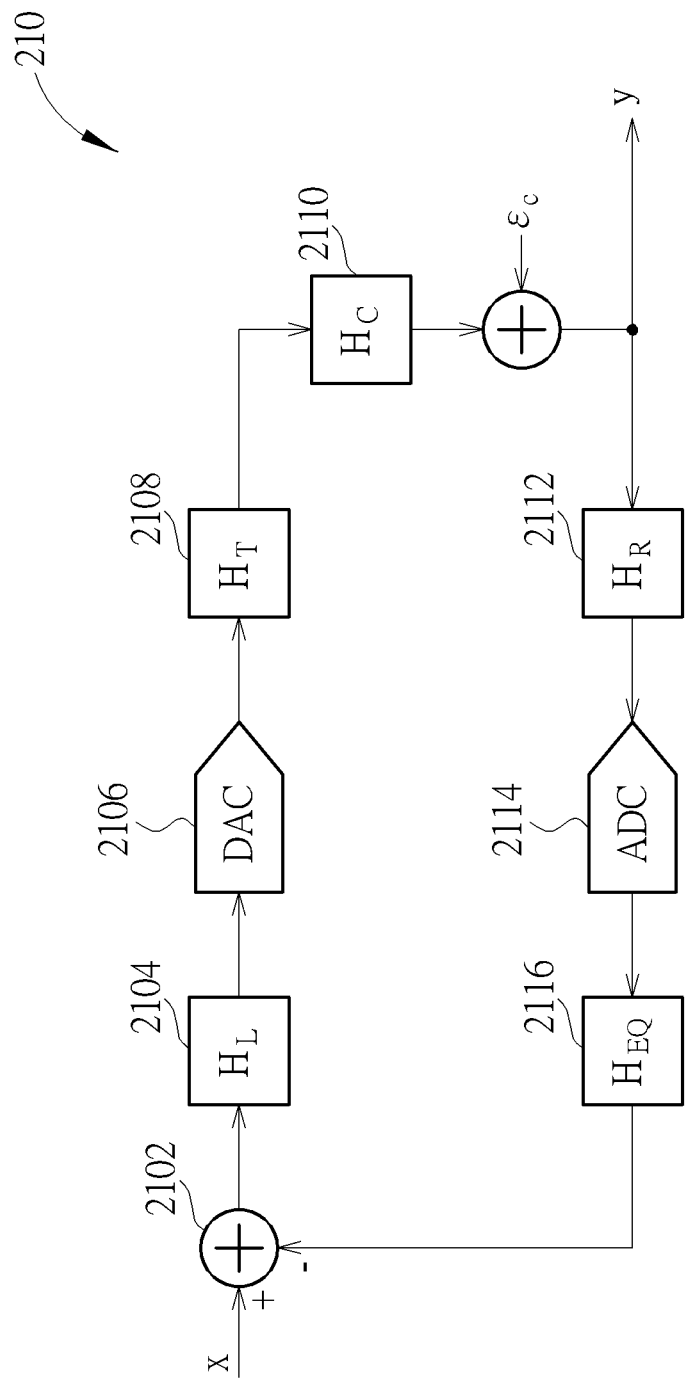
FIG. 21 is a schematic diagram of an audio system according to an embodiment of the present invention.

In an embodiment, the signal processing system of the present invention is applicable to active noise cancelation and/or noise shaping application, which may be represented as an active noise cancelation (ANC) model. As shown in FIG. 21, an audio system 210, a kind of signal processing system, includes a subtractor 2102, a sigma circuit 2104, a DAC 2106, a sound producing device 2108, a sensor 2112, an ADC 2114 and an equalizer 2116. The audio or signal processing system 210 may be disposed within a wearable hearing device such as earbuds headphone or earphone. The sound producing device 2108 may be a speaker. The sensor 2112 may be a microphone receiving acoustic wave in an ear canal 2110 of a user. In an embodiment, the sound producing device 2108 and the sensor 2112 may satisfy time/phase delay requirement specified in U.S. Pat. No. 10,867,594 B1 and/or U.S. application Ser. No. 17/149,666, which is not limited thereto.

The signal processing (audio) system 210 is applied to the ear canal 2110 (which may be viewed as a kind of channel), meaning that the sound producing device 2108 produces acoustic wave to the canal 2110 and the sensor senses acoustic wave from the canal 2110. In this case, the canal 2110 plays a role as the distortion portion, and the distortion component brought by the distortion portion (i.e., the canal 2110) may be occlusion noise and/or other type of noise within the canal 2110, denoted as $\varepsilon_c$ in FIG. 21.

In other words, the system 210 with the sigma circuit 2104 along with the subtractor 2102 may perform a sigma-delta operation of any order that can be used to shift the noises or distortions to/toward higher frequencies. The sigma circuit 2104 may be realized by at least one of sigma circuit stated in the above. The DAC 2106 is configured to convert the digital signals generated from the sigma circuit 2104 into analog signals. The canal 2110 may refer to a channel that allows the user to receive and hear the sounds. The sensor 2112 may be, for example, a microphone, for sensing the sounds and correspondingly generating feedback signals. The ADC 2114 is configured to convert the feedback signals into the digital domain, allowing the sigma circuit 2104 to deal with the noises based on the feedback loop. The equalizer 2116 is configured to equalize the audio signals, to compensate for the transfer functions generated in the analog domain.

More specifically, the sigma circuit 2104, the sound producing device 2108, the canal 2110, the sensor 2112 and the equalizer 2116 may have transfer functions $H_L$, $H_T$, $H_C$, $H_R$ and $H_{EQ}$, respectively. The audio system 210 is configured to receive an input signal x and correspondingly output an output signal y. The noise $\varepsilon_c$, which may be modeled additively and received by the sensor 2112, may be occlusion noise or generated from a background noise, chuckle, choke, and/or other oral sounds made by a user. Under the feedback structure as shown in FIG. 21, the transfer function of the overall audio system 210 may be expressed as:

$$Y(z) = \frac{H_C H_T H_L}{1 + H_{EQ} H_R H_C H_T H_L} X(z) + \frac{1}{1 + H_{EQ} H_R H_C H_T H_L} E_c(z).$$

Supposing that the transfer functions $H_T$, $H_C$ and $H_R$ are known and invertible, the transfer function $H_{EQ}$ of the equalizer 2116 may be designed to be equal to $H_T^{-1} H_C^{-1} H_R^{-1}$. In such a situation, the transfer function of the overall audio system 210 may be simplified to be:

$$Y(z) = \frac{H_L}{1 + H_L} H_C H_T X(z) + \frac{1}{1 + H_L} E_C(z).$$

Similar to the design scheme of the sigma circuit as described above, the NTF, $1/(1+H_L)$, may be determined to achieve an appropriate high pass filter with any order to filter out the noises in the lower frequencies, i.e., the audible frequencies, while keeping the system stability. The transfer function $H_L$ and the STF are thereby determined according to the NTF.

Similarly, the input signal x of the audio system 210 may be implemented in any feasible manner. In an embodiment, the input signal x received by the sigma circuit 2104 may be a general baseband signal. Alternatively, the input signal x may be an SDM encoded signal, or equivalently, a signal generated from an SDM encoder provided in the present invention. In this regard, the illustration in FIG. 21 may be viewed as an embodiment of the system 82 shown in FIG. 23.

As mentioned above, the transfer functions of the sound producing device 2108, the canal 2110 and the sensor 2112 have known values. In an embodiment, if their combination is 1, the equalizer 2116 may be omitted. Alternatively or additionally, the DAC 2106 and the ADC 2114 may be omitted if the audio system 210 is an analog system in its entirety, i.e., the sigma circuit 2104 and the equalizer 2116 are implemented in the analog domain. In another embodiment, the ANC model may be modified to include a delay element between the sound producing device 2108 and the canal 2110 and/or between the canal 2110 and the sensor 2112. The delay element may represent a delay between the actuator and the sensor.

Figure 25:
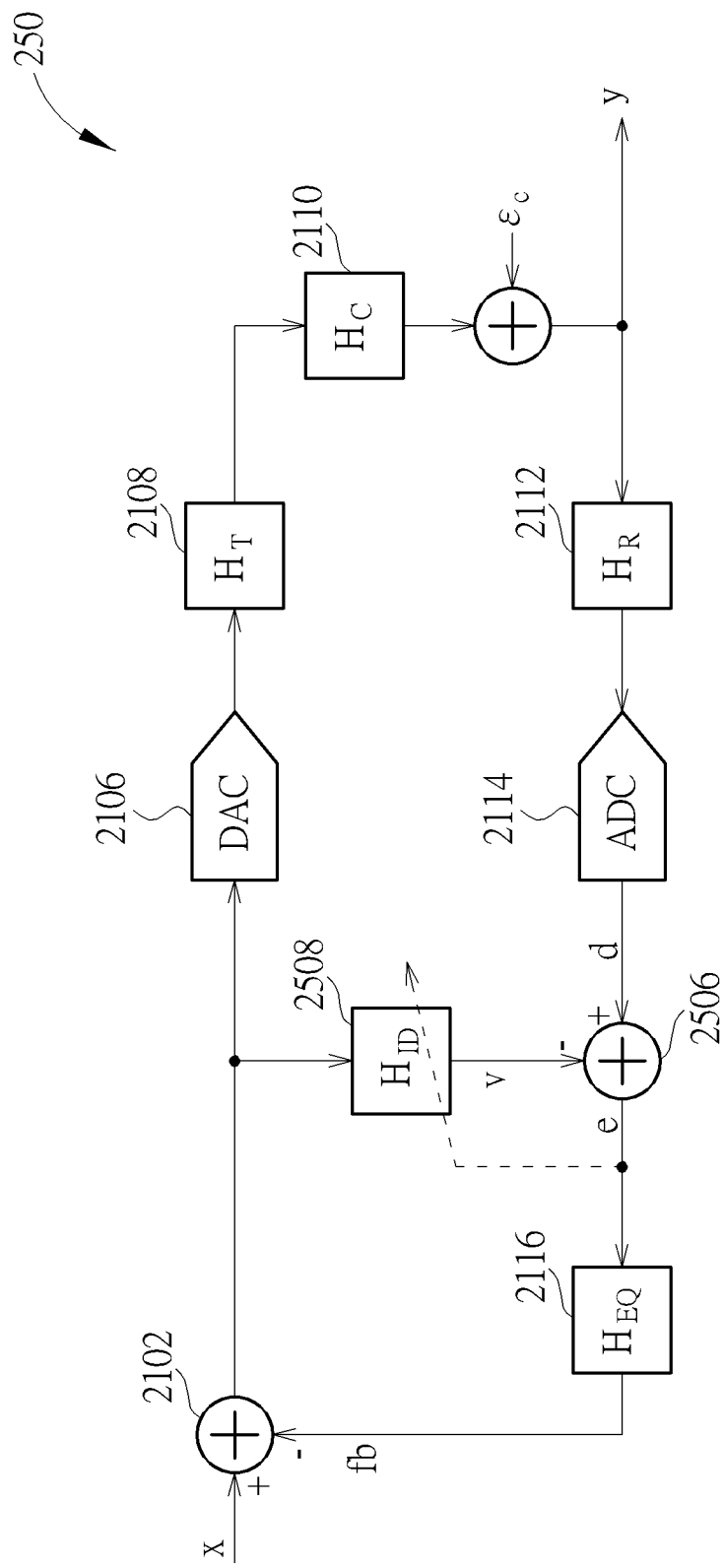
FIG. 25 illustrates a schematic diagram of a signal processing (audio) system.

FIG. 25 illustrates a schematic diagram of a signal processing (audio) system 250. The system 250 is also capable of performing ANC. The system is similar to the system 210, and thus, same components are denoted by the same symbols. Different from FIG. 21, a time delay (or latency) $\tau_1$ may exist between an output terminal of the sound producing device 2108 and an input terminal of the sensor 2112. The delay $\tau_1$ may be considered as a propagation delay of acoustic wave travelling from the sound producing device 2108 to the sensor 2112, and the delay $\tau_1$ may be embedded inside the canal 2110.

In this case, the system 250 comprises a subtractor 2506 and an identification filter 2508. The identification filter 2508 may be configured to identify a response between an input terminal of the sound producing device 2108 and an output terminal of the sensor 2112, or to identify a response between an input terminal of the DAC 2106 and an output terminal of the ADC 2114, such that the identification filter 2508 would take the delay $\tau_1$ into consideration. The subtractor 2506 performs a subtraction operation on an output signal d from the ADC 2114 and an output signal v from the identification filter 2508. A feedback signal fb is generated according to a subtraction result (or an error signal) e, for example, by the equalizer 2116.

In addition, filter coefficients of the identification filter 2508 may be occasionally trained (adaptively adjusted) according to the error signal e. Usually, a training process for the filter coefficients would be ceased when the training process enters into a steady state, which may represent that an amount of adjustment for the coefficients is less than a certain threshold. In other words, when the training process enters into the steady state, the filter coefficients of the identification filter 2508 would not be adjusted.

In one perspective, the ear canal itself may be viewed as the distortion portion or the channel. In another perspective, an aggregation of the sound producing device 2108, the canal 2110 and the sensor 2112, or an aggregation of the DAC 2106, the sound producing device 2108, the canal 2110, the sensor 2112 and the ADC 2114, can be viewed as the distortion portion or the channel.

Similarly, the input signal x shown in FIG. 25 may also be a SDM encoded signal. In this case, the illustration in FIG. 25 may be viewed as an embodiment of the system 84 shown in FIG. 24.

To sum up, the present invention provides an SDM encoder and a related signal processing system applicable to an audio system. The SDM encoder includes a sigma circuit and a multi-bit quantizer, where the multi-bit quantizer is used to replace the comparator of the PDM circuit, to provide a more efficient quantization scheme and improve the power consumption problem of the PDM circuit. The sigma circuit with an appropriate design may achieve higher-order noise shaping effects while keeping a satisfactory stability. More specifically, the sigma circuit is capable of moving the noises and/or distortions of the system to higher frequencies, so as to reduce the noises/distortions in the audible frequency range. These noise shaping effects may be applicable to, but not limited to, a DSR circuit and a class-X amplifier. With the usage of a higher-order sigma circuit, the SDM encoder may achieve a high SQNR and/or SNDR using only a few numbers of bits. In an embodiment, the sigma circuit may be used to deal with any type of noises and/or distortions. In addition to the quantization noises of the multi-bit quantizer, the noises/distortions may include, but not limited to, the non-linear distortion, soft-clipping distortion, and the distortion generated from a class-AB amplifier. Such noises/distortions may be removed from the audible frequencies and shifted to higher frequencies using the sigma circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal density modulation (SDM) encoder, the SDM encoder comprising:
    a first subtractor, receiving an input signal;
    a sigma circuit, coupled to the first subtractor; and
    a multi-bit quantizer, coupled to the first subtractor and the sigma circuit, configured to generate an output signal;
    wherein the sigma circuit or the multi-bit quantizer produces a first feedback signal to the first subtractor;
    wherein the first subtractor performs a subtraction operation according to the first feedback signal and the input signal, and generates a delta signal;
    wherein the sigma circuit performs an operation on the delta signal, such that the SDM encoder has a noise transfer function having a high pass filtering effect;
    wherein the noise transfer function is a ratio of a quantization error brought by the multi-bit quantizer with respect to the input signal;
    wherein the output signal has more than two levels.

2. The SDM encoder of claim 1, wherein the levels of the output signal generated by the multi-bit quantizer are represented by at least two bits.

3. The SDM encoder of claim 1, wherein the sigma circuit comprises:
    at least one integrator, coupled between the first subtractor and an input terminal of the multi-bit quantizer; and
    a delay element, coupled between the first subtractor and an output terminal of the multi-bit quantizer.

4. The SDM encoder of claim 1, wherein the sigma circuit comprises:
    a delay element, coupled between the first subtractor and an input terminal of the multi-bit quantizer; and
    a second subtractor, coupled between an output terminal of the multi-bit quantizer and an output terminal of the delay element.

5. The SDM encoder of claim 4, wherein the sigma circuit further comprises:
    a filter, coupled between the second subtractor and the first subtractor, configured to receive an error signal from the second subtractor and correspondingly output the first feedback signal to the first subtractor;
    wherein the filter is a digital finite impulse response (FIR) filter, and filter coefficients of the filter is chosen such that the noise transfer function is proportional to $(1-z^{-1})^N$, N is an integer.

6. The SDM encoder of claim 1, wherein
    the sigma circuit comprises a filter, and the filter is designed such that the noise transfer function is proportional to a transfer function of a high pass filter, and the SDM encoder is an $N^{th}$-order SDM encoder;
    the filter provides a stability improvement when N is greater than or equal to 3;
    the filter is a digital infinite impulse response (IIR) filter.

7. The SDM encoder of claim 6, wherein the noise transfer function of the SDM encoder with the filter is proportional to a transfer function of a high pass Butterworth filter.

8. The SDM encoder of claim 1, wherein the output signal generated by the multi-bit quantizer have at least 16 levels.

9. The SDM encoder of claim 1, wherein the SDM encoder is coupled to a load, the load produces a load quantity, and the load quantity corresponding to a specific time is dependent on the load quantity corresponding to time before the specific time.

10. The SDM encoder of claim 1, wherein the SDM encoder is coupled to a load, the load produces a load quantity, and the load quantity corresponding to a specific time is independent of the load quantity corresponding to any time before the specific time.

11. The SDM encoder of claim 1, wherein
    the SDM encoder is coupled to a system applying on a channel;
    the system generates a second feedback signal according to a channel output from the channel;
    the system generates a channel input to the channel according to the output signal produced by the SDM encoder and the second feedback signal.

12. The SDM encoder of claim 11, wherein the channel causes a time delay between the channel input and the channel output.

13. The SDM encoder of claim 11, wherein
    the system comprises a third subtractor;
    the third subtractor subtracts the second feedback signal from the output signal produced by the SDM encoder and generates a first subtraction result;
    the channel input is generated according to the first subtraction result produced by the third subtractor.

14. The SDM encoder of claim 11, wherein
    the system comprises an identification filter and a fourth subtractor;
    the identification filter receives the channel input and generates an identification output according to the channel input;
    the fourth subtractor generates a second subtraction result according to the identification output and the channel output;

the system generates the second feedback signal according to the second subtraction result.

15. The SDM encoder of claim 1, wherein the SDM encoder is coupled to a capacitive load or an amplifier comprising at least a direct-current-to-direct-current (DC-DC) converter.

16. The SDM encoder of claim 1, wherein the SDM encoder is coupled to a plurality of sound generating cells, and the output signal generated by the SDM encoder is applied to the plurality of sound generating cells.

17. A digital sound reconstruction system, comprising:
the SDM encoder of claim 1;
a plurality of sound generating cells, wherein an output terminal of the SDM encoder is coupled to the plurality of sound generating cells; and
a pre-equalizer, wherein an input terminal of the SDM encoder is coupled to a pre-equalizer.

18. The digital sound reconstruction system of claim 17, wherein the pre-equalizer comprises an integrator.

19. A signal processing system, comprising:
a first subtractor, receiving an input signal; and
a sigma circuit, coupled to the first subtractor
wherein the signal processing system is applied to a distortion portion;
wherein the distortion portion produces a distortion component;
wherein the sigma circuit produces a first feedback signal to the first subtractor;
wherein the first subtractor performs a first subtraction operation according to the first feedback signal and the input signal, and generates a delta signal;
wherein the sigma circuit performs an operation on the delta signal, such that the signal processing system has a noise transfer function having a high pass filtering effect;
wherein the noise transfer function is a ratio of the distortion component brought by the distortion portion with respect to the input signal;
wherein the distortion portion comprises no 1-bit quantizing circuit.

20. The signal processing system of claim 19, wherein the sigma circuit comprises:
at least one integrator, coupled between the first subtractor and an input terminal of the distortion portion, configured to perform an integration operation on the delta signals.

21. The signal processing system of claim 19, wherein the signal processing system is disposed within a wearable hearing device;
the distortion portion comprise an ear canal of a user, and the distortion component comprises an occlusion noise within the ear canal;
the wearable hearing device comprises a sound producing device and a sensor;
the sound producing device produces a first acoustic wave into the ear canal;
the sensor senses a second acoustic wave from the ear canal.

22. The signal processing system of claim 19, wherein the sigma circuit is configured to remove a distortion energy of the distortion component from a low-frequency band to a high-frequency band due to the high pass filtering effect of the noise transfer function.

23. The signal processing system of claim 19, wherein the distortion comprises at least one of a non-linear distortion, a soft-clipping distortion, and a distortion generated from a class-AB amplifier.

24. The signal processing system of claim 19, wherein the signal processing system receives the input signal from a signal density modulation (SDM) encoder.

* * * * *